United States Patent
Gogl et al.

(10) Patent No.: US 7,161,861 B2
(45) Date of Patent: Jan. 9, 2007

(54) SENSE AMPLIFIER BITLINE BOOST CIRCUIT

(75) Inventors: Dietmar Gogl, Essex Junction, VT (US); Hans-Heinrich Viehmann, Munich (DE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 10/988,787

(22) Filed: Nov. 15, 2004

(65) Prior Publication Data

US 2006/0104136 A1   May 18, 2006

(51) Int. Cl.
*G11C 7/02* (2006.01)
*G11C 7/00* (2006.01)
(52) U.S. Cl. .......................... 365/207; 365/205
(58) Field of Classification Search ................ 365/207, 365/205, 203, 210
See application file for complete search history.

(56) References Cited

U.S. PATENT DOCUMENTS

| | | | | | |
|---|---|---|---|---|---|
| 4,866,674 A | * | 9/1989 | Tran | ...................... | 365/189.11 |
| 4,951,252 A | * | 8/1990 | White et al. | ........... | 365/189.11 |
| 5,982,666 A | * | 11/1999 | Campardo | ............. | 365/185.21 |
| 6,469,929 B1 | * | 10/2002 | Kushnarenko et al. | . | 365/185.06 |

OTHER PUBLICATIONS

Debrosse, J., et al., "A High-Speed 128-kb MRAM Core for Future Universal Memory Applications," IEEE Journal of Solid-State Circuits, Apr. 2004, pp. 678-683, vol. 39, No. 4.
Tehrani, S., et al., "Recent Developments in Magnetic Tunnel Junction MRAM," IEEE Transactions on Magnetics, Sep. 2000, pp. 2752-2757, vol. 36, No. 5.

* cited by examiner

*Primary Examiner*—Anh Phung
(74) *Attorney, Agent, or Firm*—Slater & Matsil, L.L.P.

(57) ABSTRACT

A current sense amplifier including clamping devices and a current mirror is configured to sense the resistance of an MTJ memory cell utilizing a bitline boost circuit to shorten the charging time for parasitic circuit capacitance. The bitline boost circuit includes a source follower coupled to a reference voltage and a switch coupled to another voltage source. The switch is enabled to conduct during an initial period of sensing the resistance of the memory cell. The source follower in the bitline boost circuit is configured to clamp the voltage of an input signal at substantially the same level as the clamping devices, and to provide additional current to shorten the period for charging parasitic capacitance. The resulting current sense amplifier can be used to implement a memory device with fast and reliable read times and low manufacturing cost.

16 Claims, 13 Drawing Sheets

SENSE AMPLIFIER BITLINE BOOST CIRCUIT

CROSS-REFERENCE TO RELATED APPLICATIONS

The following U.S. patents and/or commonly assigned patent applications are hereby incorporated herein by reference:

| U.S. Pat. No. or U.S. Application Ser. No. | Filing Date | Issue Date |
| --- | --- | --- |
| 6,946,882 | Dec. 20, 2002 | Sep. 20, 2005 |
| 10/937,155 | Sep. 7, 2004 | |
| 10/982,026 | Nov. 4, 2004 | |
| 10/925,487 | Aug. 25, 2004 | |

TECHNICAL FIELD

Embodiments of the present invention relate generally to a magnetoresitive memory device and the preferred embodiment relates more particularly to using a bitline boost circuit to decrease the time required to charge parasitic circuit capacitance when sensing the programmed state of a magnetic random access memory cell.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which uses a charge to store information.

Various memory types are in common use to digitally store a substantial amount of data. DRAMs have moderate cost, are very fast and can have access times on the order of a few nanoseconds, but lose the stored data upon loss of electrical power, i.e., they are "volatile." Present "flash" memories are non-volatile, are more expensive perhaps by a factor of ten, and have access times near a microsecond. Hard-disk drives are substantially lower in cost than DRAMs, are non-volatile, but have access times generally greater than a millisecond. Further application considerations for each technology include limitations on the number of times a memory cell can be written or read before it deteriorates, how long it reliably retains data, its data storage density, how much energy it consumes, the need for integral mechanical devices such as for disk drives and tapes, and the complexity and expense of associated circuitry. In addition, memory devices based on charge storage generally need to be rewritten each time they are read, adding to their complexity and cost. Considering these limitations, there is now no ideal technology for general applications. Magnetic random access memory (MRAM) as described below appears to have properties that position it well for widely accepted digital memory applications, overcoming many of these limitations.

Spin electronics, which combines semiconductor technology and magnetics, i.e., which utilizes both the discrete electron charge and magnetic moment of electrons, is a relatively recent development in semiconductor memory devices. The spin of an electron, rather than the charge, is used to indicate the presence of a logic "1" or "0". One such spin electronic device is a resistive memory device referred to as a magnetic random access memory, which includes conductive lines usually positioned perpendicular to one another in different metal layers, the conductive lines sandwiching a magnetic stack which functions as a memory cell. The place where the conductive lines intersect is called a cross-point. A current flowing through one of the conductive lines generates a magnetic field around the conductive line and orients the magnetic polarity of one layer of the magnetic stack. A current flowing through the other conductive line induces a superimposed magnetic field and can partially turn the magnetic polarity, also. Digital information, represented as a "0" or "1", is storable in the alignment of magnetic moments in the magnetic stack. The resistance of the magnetic stack depends on the moment's alignment. The stored state is read from the magnetic stack by detecting the component's resistive state. An array of memory cells may be constructed by placing the conductive lines in a matrix structure having rows and columns, with the magnetic stack being placed at the intersection of the conductive lines.

A key advantage of MRAMs compared to traditional semiconductor memory devices, such as DRAMs, is that MRAMs are non-volatile upon removal of electrical power. This is advantageous because a personal computer (PC) utilizing MRAMs could be designed without a long "boot-up" time as with conventional PCs that utilize DRAMs, as an example. Moreover, MRAMs do not need to be rewritten when they are read. In addition, MRAMs have the potential for read/write speeds in the range of a few nanoseconds, which compares favorably with fast memory technologies now available.

FIG. 1 illustrates a magnetic tunnel junction (MTJ) stack capable of storing one bit that comprises a resistive or magnetic memory cell. The terms "memory cell," "MTJ," "MTJ cell," and "MTJ stack" are used interchangeably herein and refer to the MTJ shown in FIG. 1. The MTJ comprises at least two ferromagnetic layers M1 and M2 that are separated by a tunnel layer TL. The MTJ stack is positioned at the cross-point of two conductors referred to as a wordline WL and a bitline BL. One magnetic layer M1 is referred to as a free layer or a storage layer, and the other magnetic layer M2 is referred to as a fixed layer or a reference layer. Two publications describing the art of MRAMs are S. Tehrani, et al., "Recent Developments in Magnetic Tunnel Junction MRAM," IEEE Trans. on Magnetics. Vol. 36, Issue 5, September 2000, pp. 2752–2757, and J. DeBrosse, A. Bette et al., "A High Speed 128-kb MRAM Core for Future Universal Memory Applications," IEEE Journal of Solid State Circuits, Vol. 39, Issue 4, April 2004, pp. 678–683, which are both hereby referenced and included herein. The magnetic orientation of the free layer M1 can be changed by the superposition of the magnetic fields caused by a programming current IBL that is run through the bitline BL and a programming current IWL that is run through the wordline WL. A bit, e.g., a "0" or "1", may be stored in the MTJ stack by changing the orientation of the field of the free magnetic layer relative to that of the fixed magnetic layer. If both magnetic layers M1 and M2 have the same orientation, the MTJ stack has a lower resistance RC. The resistance RC is higher if the magnetic layers have opposite magnetic orientations.

FIG. 2 illustrates a memory cell of an MRAM device 10 from an array of MRAM device having a select transistor X1. In some MRAM array designs, the MTJ stack is combined with a select transistor X1, as shown in FIG. 2, which is a cross-sectional view of a 1T1MTJ design (one transistor and one MTJ stack). The 1T1MTJ design uses the select transistor X1 for fast access of the MTJ during a read operation. A schematic diagram of the MTJ stack and select transistor X1 is shown in FIG. 3. A bitline BL is coupled to one side of the MTJ stack, and the other side of the MTJ stack is coupled to the drain D of the select transistor X1 by metal layer MX, via VX, and a plurality of other metal and via layers, as shown. The source S of the transistor X1 is coupled to ground (GND). X1 may comprise two parallel transistors that function as one transistor, as shown in FIG. 2. Alternatively, X1 may comprise a single transistor, for example. The gate G of the transistor X1 is coupled to a read wordline (RWL), shown in phantom, that is preferably positioned in a different direction than, e.g., perpendicular to the bitline BL direction.

The select transistor X1 is used to access the memory cell's MTJ. In a read (RD) operation during current sensing, a constant voltage is applied at the bitline BL. The select transistor X1 is switched on, e.g., by applying a voltage to the gate G by the read wordline RWL, and current then flows through the bitline BL, the magnetic tunnel junction MTJ, over the MX layer, down the metal and via stack, through the transistor drain D, and through the transistor X1 to ground GND. This current is then measured and is used to determine the resistance of the MTJ, thus determining the programming state of the MTJ. To read another cell in the array, the transistor X1 is switched off, and the select transistor of the other cell is switched on.

The programming or write operation is accomplished by programming the MTJ at the cross-points of the bitline BL and the programming line or write wordline WWL using selective programming currents. For example, a first programming current IBL passed through the bitline BL causes a first magnetic field component in the MTJ stack. A second magnetic field component is created by a second programming current IWL that is passed through the write wordline WWL, which may run in the same direction as the read wordline RWL of the memory cell, for example. The superposition of the two magnetic fields at the MTJ produced by programming currents IBL and IWL causes the MTJ stack to be programmed. To program a particular memory cell in an array, typically a programming current is run through the write wordline WWL, which creates a magnetic field at all cells along that particular write wordline WWL. Then, a current is run through one of the bitlines, and the superimposed magnetic fields switch only the MTJ stack at the cross-point of the write wordline WWL and the selected bitline BL.

Current sensing may be used to detect a resistance change of resistive memory cells. Current sensing is the desired method of sensing the state of MRAM cells, for example. In current sensing, a voltage is applied to the bitline, and the bitline voltage is kept constant with a sense amplifier. The cell current is directly measured, with the cell current being dependent on the resistance of the memory cell being read. The use of current sensing reduces the capacitive load problem from long bitlines that may occur in voltage sensing because the voltage of the sensed lines is held constant, thereby avoiding altering charge in the different interconnection capacitances of different memory cells.

However, a limitation of a magnetic tunnel junction cell resistance sensing process as described above is the time required to charge parasitic circuit capacitance when sensing its programmed state. When a selected cell is sensed, its resistance is essentially compared to the resistance of a reference cell that might be configured with the average resistance of a cell programmed to store a "0" and a cell programmed to store a "1." One end of the selected cell and one end of the reference cell are coupled to circuit ground and the other ends to fixed but separate voltage sources. These fixed voltage sources, such as 250 mV sources, are included to remove the voltage-dependent component of cell resistance from the measurement. The fixed voltage sources are generally configured as source followers with substantially identical output (source) voltages. To provide the same output voltages they are formed with substantially identical (or substantially proportional) semiconductor features and they conduct the same (or proportional) currents so that they exhibit the same gate-to-source voltage drops. Gate-to-source voltage drop is a highly variable characteristic of the manufacture of metal-oxide semiconductor field-effect transistors (MOSFETs), but identical devices on the same die (or even on the same wafer) can be configured to predictably have the same gate-to-source voltage drops. In addition, a current mirror is used to supply current to the cell to be sensed that is substantially identical (or substantially proportional) to the current flowing in a reference cell so that the small changes in cell resistance of the sensed cell can be reliably detected. A characteristic of the cell resistance sensing process is a preset and thus a limited current for the sensed resistance, which substantially restricts the remaining current available to charge circuit parasitic capacitance. Since circuit voltage settling time is inversely proportional to the available capacitance charging current, these prior art circuits limit the speed at which cell resistance can be sensed.

Thus, to increase the speed of sensing MRAM cell resistance and thereby its programmed state a technique is required to increase the current available to charge circuit parasitic capacitance, at least during the initial phase of the MRAM cell resistance sensing process, while providing a clamped, fixed voltage to the sensed cell during the resistance sensing process.

The devices described herein with a resistance dependent on a programmed state of a free magnetic layer are preferably based on the tunneling magnetoresistance effect (TMR), but, alternatively, may be based on other magnetic-orientation dependent resistance effects such as the giant magnetoresistance effect (GMR) or other magnetic-orientation dependent resistance effects relying on the electron charge and its magnetic moment. The programmable resistance devices described herein will generally be described as TMR devices with a resistance dependent on its programmed magnetic state, but other devices based on the GMR or other effects wherein a resistance is dependent on its magnetically programmed state may be readily substituted for the TMR devices within the broad scope of the present invention.

SUMMARY OF THE INVENTION

In one aspect, the present invention relates to utilizing the resistance characteristics of MTJ devices, including devices based on GMR or another mechanism in which a resistance is dependent on the direction of polarization of a free magnetic layer with respect to a fixed magnetic layer, that can exhibit distinct resistance values dependent on the magnetic orientation of a magnetic layer so that digital data can be stored and read. In response to the need to quickly alter the charge in parasitic capacitance in the circuit during the cell sensing process while providing a fixed voltage to the cell when the cell resistance is being sensed, the present invention provides a bitline boost circuit to increase the available current to charge parasitic capacitance. The bitline boost circuit is configured so that substantially the same voltage is provided to the cell while it is being sensed as the original circuit, and additional current is provided during an initial cell resistance sensing period to charge parasitic capacitance. Thereby the design of high density and low cost MTJ memory devices is enabled which can be read reliably with increased speed.

Embodiments of the present invention achieve technical advantages by configuring a current sense amplifier to sense the resistance of a memory cell with a bitline boost circuit. The current sense amplifier includes a voltage comparator having a first input, a second input, and an output, and a current mirror coupled between the first and second inputs of the voltage comparator. The output of the voltage comparator indicates the logic state of the memory cell. The current sense amplifier also includes first and second clamping devices coupled between the first and second inputs of the voltage comparator and a first node and a second node conducting first and second input signals, respectively, to the current sense amplifier. The first and second clamping devices of the current sense amplifier are coupled to a reference voltage. The bitline boost circuit is configured to clamp the voltage of the first signal at substantially the same level as the first clamping device. The bitline boost circuit is also configured to provide a current to the node conducting the first signal during an initial period of sensing the resistance of the memory cell. The bitline boost circuit includes a source follower coupled to the reference voltage and a switch coupled to a voltage source. The source follower includes a source, a gate, and a drain, the gate being coupled to the reference voltage and the gate being coupled to the first signal. The drain of the source follower is coupled to the switch. The switch is controlled to conduct during an initial period of sensing the resistance of a memory cell, thereby providing current to the source follower to charge circuit parasitic capacitance. Preferably, the source follower is configured with an n-type MOSFET and the switch is configured with a p-type MOSFET. The resulting current sense amplifier can be used to implement a memory device with fast read times and that can be manufactured with low cost.

In accordance with another preferred embodiment of the present invention a memory device is configured with a current sense amplifier that senses the resistance of memory cells using a bitline boost circuit. The current sense amplifier includes a voltage comparator having a first input, a second input, and an output, and a current mirror coupled between the first and second inputs of the voltage comparator. The output of the voltage comparator signals the logic state of the memory cell. The current sense amplifier also includes first and second clamping devices coupled between the first and second inputs of the voltage comparator and a first node and a second node conducting first and second input signals, respectively, to the current sense amplifier. The first and second clamping devices of the current sense amplifier are coupled to a reference voltage. The bitline boost circuit is configured to clamp the voltage of the first signal at substantially the same level as the first clamping device. The bitline boost circuit is also configured to provide a current to the node conducting the first signal during an initial period of sensing the resistance of the memory cell. The bitline boost circuit includes a source follower coupled to the reference voltage and a switch coupled to a voltage source. The source follower includes a source, a gate, and a drain, the gate being coupled to the reference voltage and the gate being coupled to the first signal. The drain of the source follower is coupled to the switch. The switch is controlled to conduct during an initial period of sensing the resistance of a memory cell, thereby providing current to the source follower to charge circuit parasitic capacitance. Preferably, the source follower is configured with an n-type MOSFET and the switch is configured with a p-type MOSFET. Preferably, the memory device is configured with MTJ cells. The resulting memory device can provide fast read times and can be manufactured with low cost.

Another embodiment of the present invention is a method of configuring a current sense amplifier to sense the resistance of a memory cell with a bitline boost circuit. The method includes configuring the current sense amplifier with a voltage comparator having a first input, a second input, and an output, and a current mirror coupled between the first and second inputs of the voltage comparator. The method includes configuring the output of the voltage comparator to signal the logic state of the memory cell. The method includes configuring the current mirror to supply a current to the second node that is proportional to the current in the first node. The method also includes configuring the current sense amplifier with first and second clamping devices coupled between the first and second inputs of the voltage comparator and configuring a first node and a second node to conduct first and second input signals, respectively, to the current sense amplifier. The method also includes coupling the first and second clamping devices of the current sense amplifier to a reference voltage. The method further includes configuring the first clamping device so that it clamps a voltage of the node conducting the first signal to a voltage related to the reference voltage. The method further includes configuring the second clamping device so that it clamps a voltage of the node conducting the second signal to substantially the same level as the first clamping device. The method further includes configuring the bitline boost circuit to clamp the voltage of the first signal at substantially the same level as the first clamping device. The method includes configuring the bitline boost circuit to provide a current to the node conducting the first signal during an initial period of sensing the resistance of the memory cell. The method includes providing the bitline boost circuit with a source follower and coupling it to the reference voltage, and then coupling a switch to a voltage source. The method includes configuring the source follower with a source, a gate, and a drain, coupling the gate to the reference voltage and coupling the gate to the first signal. The method further includes coupling the drain of the source follower to the switch. The method includes controlling the switch to conduct during an initial period of sensing the resistance of a memory cell, and providing thereby current to the source follower to charge circuit parasitic capacitance. The method includes providing a second source follower to clamp the node conducting the second signal to the same voltage as the first clamping device clamps the node conducting the first signal. Preferably, the method includes configuring the source follower with an n-type MOSFET and configuring the switch with a p-type MOSFET. The resulting current sense amplifier can be used to implement a memory device with fast read times and low manufacturing cost.

Another embodiment of the present invention is a method of sensing the resistance of a memory cell configured with at least two logic states. The method includes receiving a first current signal at a first node and clamping a voltage of the first node to a voltage related to a reference voltage. The method further includes receiving a second current signal at a second node and clamping a voltage of the second node to the voltage related to the reference voltage. The method then includes mirroring the first current signal to a third node that has a high impedance and combining the mirrored signal at the third node with a signal representing the second current. The method includes determining the logic state of the memory cell from the voltage of the third node. The method further includes boosting the current flowing into the second node by supplying additional current to the second node while maintaining the clamping voltage of the second node to the voltage related to the reference voltage In the circuit descriptions herein, a transistor may be configured as multiple transistors coupled in parallel, or vice versa, without departing from the scope of the present invention.

Embodiments of the present invention achieve technical advantages as a memory device including MTJ cells storing digital data. Advantages of embodiments of the present invention include a memory device with increased memory density and reduced manufacturing cost, that is non-volatile upon removal of electrical power, and that does not require its data to be re-written after it has been read.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a FET MRAM device configured with a circuit to provide increased current to charge circuit parasitic capacitance during a cell resistance sensing interval to increase the speed at which a resistive state of a memory cell may be sensed. The invention may be applied to resistive memory devices and other memory devices that include a plurality of current sense amplifiers and reference current sources to detect the resistive state of MRAM memory cells configured to store digital data.

In resistive memory devices such as MRAMs, a current sensing circuit including a reference current source may be used to detect the programmed state of a memory cell based on cell resistance. A current sense amplifier scheme 11 is shown in the prior art drawing of FIG. 4. Shown is an example for a current sensing scheme 11 for a 1T1MTJ memory cell configured to store one bit using averaging of two reference cells $RC_1$ and $RC_2$ to produce a reference current at the inverting input of the current sense amplifier 12. The current sensing scheme 11 comprises a current sense amplifier 12 and a column selector 14, coupled to a memory array 16. The FETs illustrated in FIG. 4 are n-channel devices.

Figure 1:
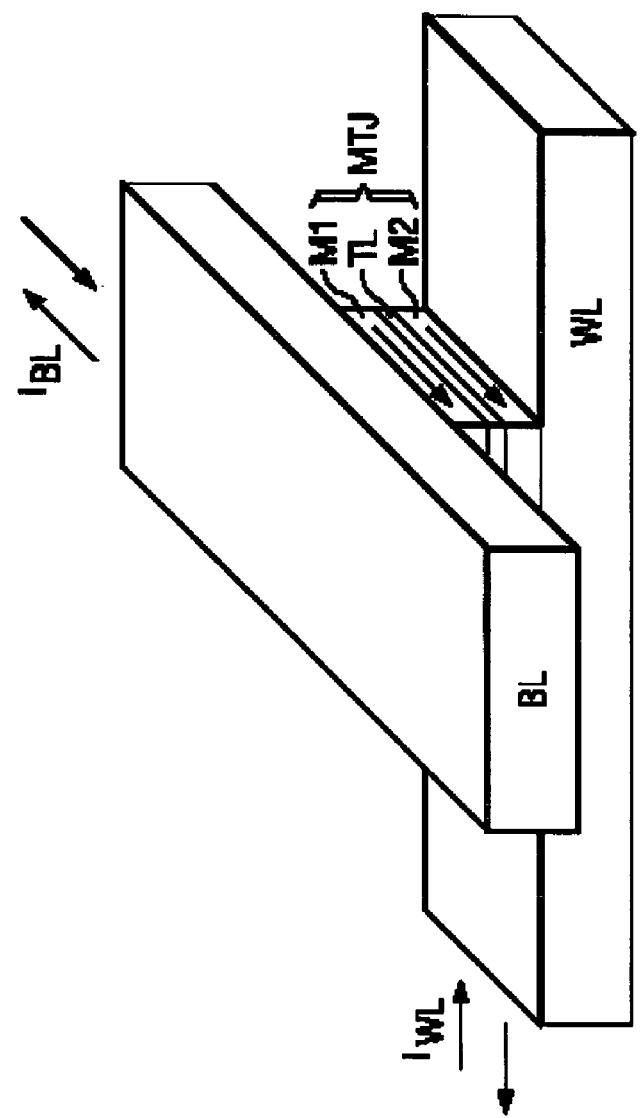
FIG. 1 shows a perspective view of a prior art MTJ stack.
Figure 2:
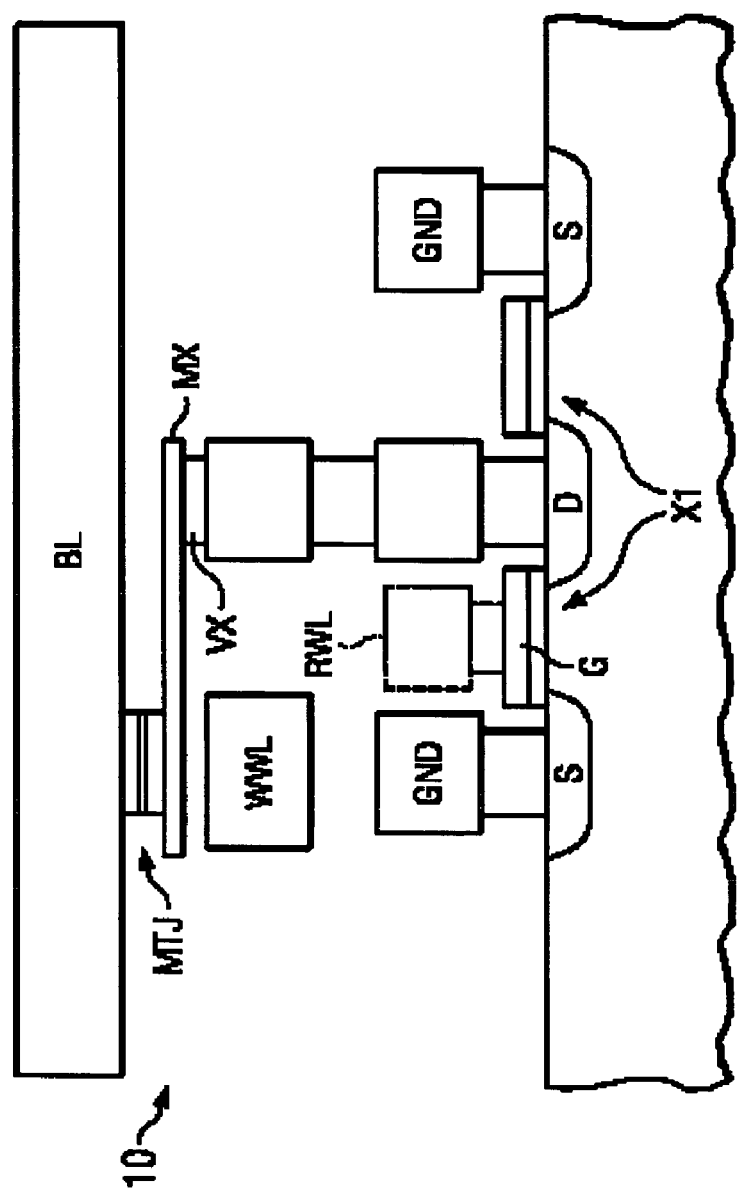
FIG. 2 shows a cross-sectional view of a prior art MRAM device having a select FET.
Figure 3:
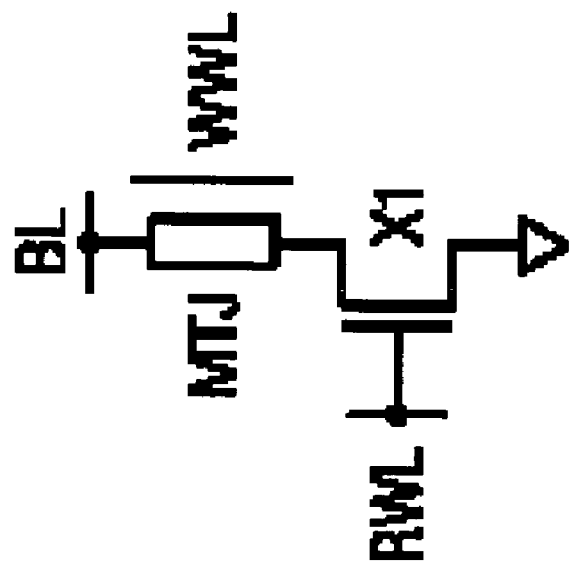
FIG. 3 is a schematic diagram of a prior art memory cell of the memory device shown in FIG. 2.
Figure 4:
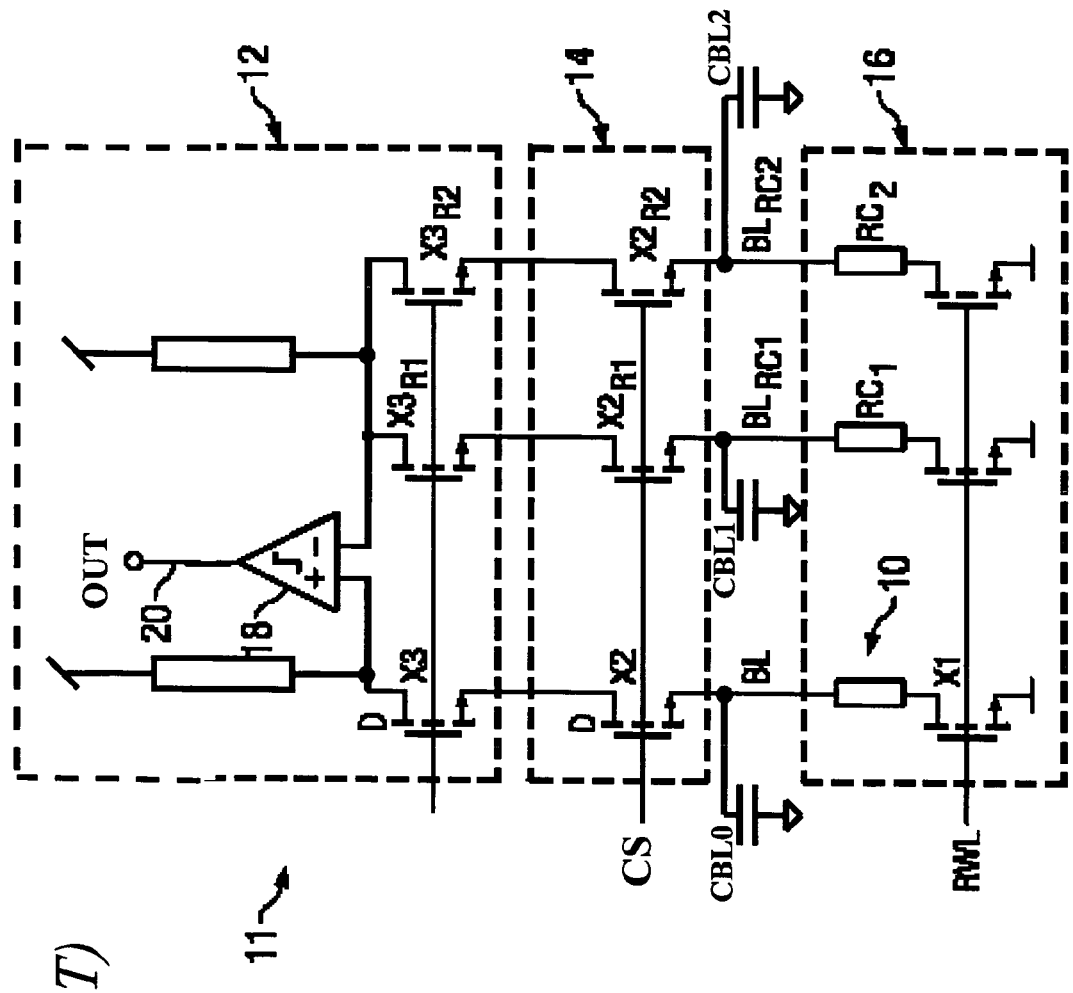
FIG. 4 is a schematic of a prior art MRAM cell current sensing circuit that averages the current of two reference cells.

In FIG. 4, as in other figures herein, like numerals and designations indicate like elements and, where appropriate, in the interest of brevity, will not be re-explained.

Only one memory cell 10 is shown in the drawing of FIG. 4; however, there may be hundreds or thousands or more memory cells in the array 16 to form a bulk memory device. The reference cells $RC_1$ and $RC_2$ preferably reside in the array with the memory cells 10, but the reference cells $RC_1$ and $RC_2$ may alternatively reside in another array 16, for example. Reference cell $RC_1$ may comprise a cell programmed as a logic 1, and reference cell $RC_2$ may comprise a cell programmed as a logic 0, for example. Each bitline BL containing a memory cell 10 is connected to at least one column select transistor X2 of the column selector 14 that is enabled to conduct by a signal CS coupled to its gate. The column selector 14 is connected to the current sense amplifier 12. The bitline clamp transistor X3, a source follower with its gate coupled to the bitline (BL) clamp voltage source, $V_{BLCLMP}$, is coupled to a selection switching circuit (not shown) that is coupled to a plurality of other memory cells, each via a column select transistor (also not shown). Cell 10, $RC_1$ and $RC_2$ are located on bitlines selected by the column selector 14. These cells are shown as examples for cells on the bitlines. Since the resistance of the memory cell 10 is preferably substantially greater than the ON resistance of the series FET switches such as source follower X3, source follower X3 effectively clamps the memory cell voltage to the BL clamp voltage minus approximately its FET threshold voltage. Memory cell voltage during a read operation is typically about 200–300 mV for an MRAM operating from a 1.8 V bias voltage source (not shown), but may be lower or higher in other applications.

As current sensing is used in FIG. 4, the selected bitlines are kept at a constant potential by bitline clamping transistors X3 during a read operation. The voltage comparator 18 compares the currents of the selected memory cell 10 with the averaged current of reference cells $RC_1$ and $RC_2$, with current scaling as required to form the averaged current. The level of the summed reference cell currents from the reference cells $RC_1$ and $RC_2$ applied to the inverting node of the voltage comparator 18 is arranged to represent the approximate midpoint between the current of an MRAM cell programmed with a logic "0" state and an MRAM cell programmed with a logic "1" state. The load devices $XL_1$ and $XL_2$ that are coupled to the bias voltage source VDD supply currents to the inverting and non-inverting inputs of the voltage comparator 18. In a preferred implementation the load devices $XL_1$ and $XL_2$ may be configured as a current mirror. In an alternative implementation, the current sense amplifier 12 may use only one reference cell, not shown, in other applications.

A read wordline RWL is coupled to the gate of the select transistor X1 of the selected cell 10. If the read wordline RWL is activated, then all of the select transistors X1 in that row of the memory array 16 are switched on. The column select transistor X2 of the column selector 14 is used to select the correct bitline BL (e.g., the column of the selected memory cell 10). The column selector 14 switches the bitline BL of the selected cell to the direction of the sense amplifier 12. The current sense amplifier 12 reads the resistive state of the selected cell 10 by comparing the cell current with the current from the reference current source. The current sense amplifier 12 comprises a voltage comparator 18 coupled to transistor X3 and transistors $X3_{R1}$ and $X3_{R2}$ of the reference paths for reference cells $RC_1$ and $RC_2$. The current sense amplifier 12 maintains a constant bitline BL voltage during a read operation, using the source-follower clamping transistors X3, $X3_{R1}$ and $X3_{R2}$ that are coupled to the signal "BL clamp voltage." The voltage comparator 18 compares the current through bitline clamp transistor X3 of the selected cell 10 with the average of the currents through $X3_{R1}$ and $X3_{R2}$ of the reference cells, to determine the resistive state of selected cell 10, which information is output (indicated by "OUT") as a digital or logic "1" or "0" at node 20 of the current sense amplifier 12.

The sensing scheme 11 shown in FIG. 4 is disadvantageous in that it has an asymmetric structure. Two bitlines for only two reference cells $RC_1$ and $RC_2$ and column selector switches $X2_{R1}$, $X2_{R2}$ are connected to the right side (the negative input) of the comparator 18, while only one bitline and a large number of column selector switches X2 are connected to the left side (the positive input) of the current comparator 18 of the current sense amplifier 12. For example, there may be one out of 64 bitlines of memory cells 10 coupled to the positive input of the current comparator 18, and two bitlines for reference cells coupled to the negative input of the current comparator 18. The resulting parasitic capacitance associated with each bitline is represented on FIG. 4 by the capacitors CBL0, CBL1, and CBL2. Because of this asymmetry, the capacitive load of the sensing path at the positive input of the current comparator 18 is much different from the capacitive load of the reference path at the negative comparator input, i.e., CBL0 is generally much greater than CBL1 or CBL2. The capacitive load comprises the capacitance of the switching transistors X3, $X3_{R1}$ and $X3_{R2}$, and the metal lines capacitively loaded by the memory cells, e.g., the bitlines BL. This makes the circuit sensitive to many noise sources coupled into the circuit during sensing, such as power supply noise, internal asymmetric coupling of switching noise, as examples, and also increases the sensing time because of different RC time constants of the sensing paths for the selected memory cell and reference cells. Mismatches in the sensing path of an MRAM memory device tend to be significant performance limiters for the array read access time.

Figure 5:
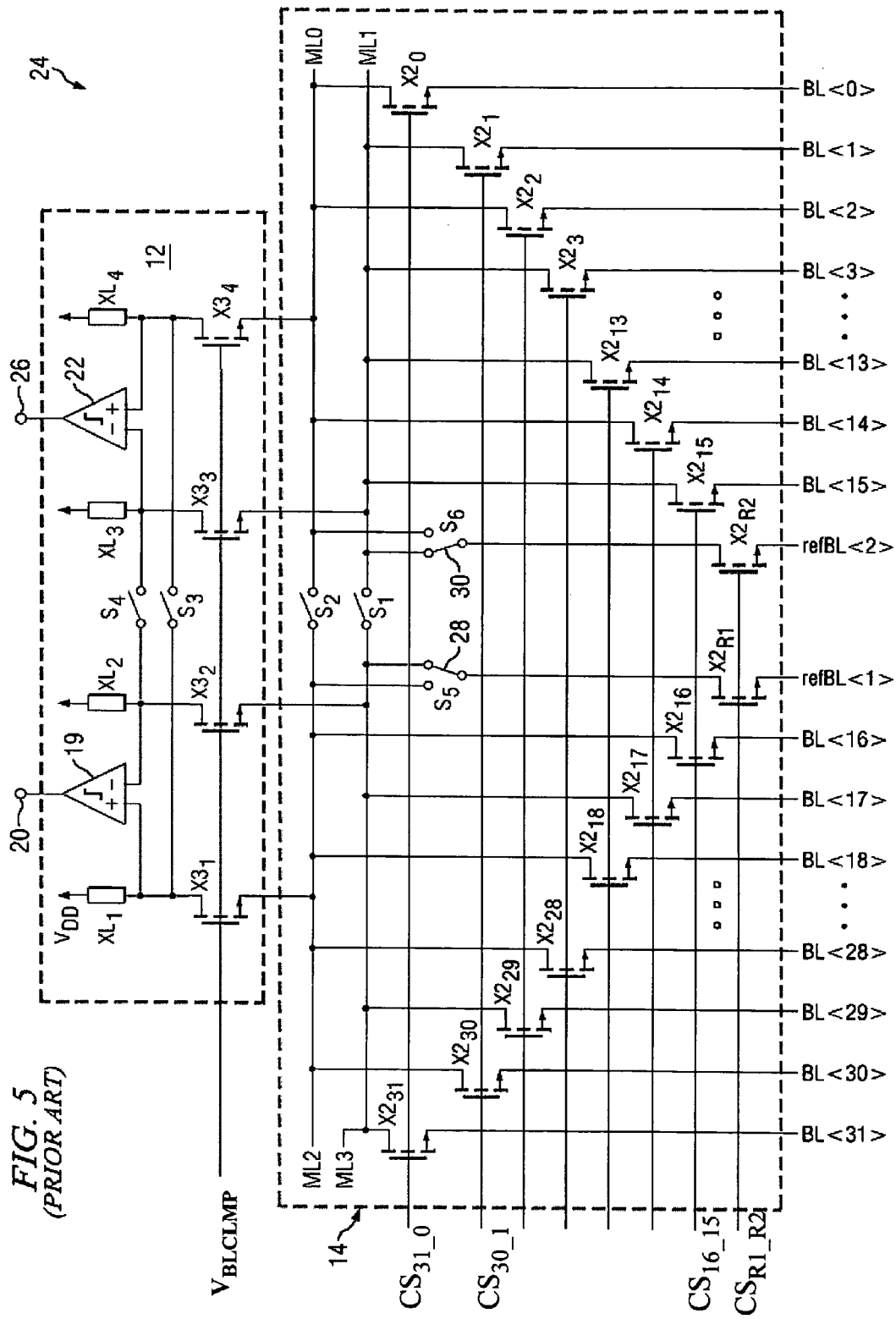
FIG. 5 illustrates a prior art circuit arrangement in which two current sense amplifiers are coupled in a symmetric sensing circuit.

A symmetric sensing scheme or circuit 24 for MRAM FET memory devices is shown in FIG. 5, further representing the prior art, which avoids some of the problems of the asymmetric sensing scheme 11 shown in FIG. 4. With a symmetric sensing circuit 24 such as the one shown, the inputs of the comparators 19 and 22 have approximately equal effective capacitive loads. No matter which bitline is read, the wiring of the sensing path and effective capacitive load are approximately equal at each input, which eliminates or reduces error voltages and noise. The reference path has twice the load of the sensing path, but the reference path is connected to two sense amplifier inputs (the negative inputs of comparators 19 and 22). Therefore, the RC constants in both sense amplifier paths are equal, and therefore the effective capacitive loads are also equal. The memory array 16 is not shown in FIG. 5; however, a memory array 16 is coupled to the column selector 14, as shown in FIG. 4.

The current sense amplifier 12 in FIG. 5 comprises a first and second voltage comparator 19 and 22, each having an output 20 and 26. The load devices $XL_1$, $XL_2$, $XL_3$, and $XL_4$ preferably comprise transistors, the load devices being the same type of devices (e.g., having the same load characteristics). Half of the select transistors $X2_{31}$, $X2_{30}$ ... $X2_{16}$, $X2_{R1}$ (and corresponding memory cells 10 in the array 16) along the bitlines BL<31> through BL<16>, refBL<1> are coupled to the first voltage comparator 19, and the other half of the select transistors $X2_{R2}$, $X2_{15}$ ... $X2_1$, $X2_0$ are coupled to a second voltage comparator 22. In this scheme 24, both sides of each current comparator 19 and 22 have the same transient behavior because of the equal effective capacitive and resistive loads on the first and second voltage comparators 19 and 22. While 16 bitlines are shown on each side in FIG. 5, there may be more bitlines, e.g., 32 or 64, as examples.

For comparator 19, odd bitlines BL<31> through BL<17> are coupled to a masterline ML3 by corresponding column select transistors $X2_{31}$ through $X2_{17}$, and even bitlines BL<30> through BL<16> are coupled to a masterline ML2 by corresponding column select transistors $X2_{30}$ through $X2_{16}$. Similarly, for comparator 22, odd bitlines BL<15> through BL<1> are coupled to a masterline ML1 by corresponding column select transistors $X2_{15}$ through $X2_1$, and even bitlines BL<14> through BL<0> are coupled to a masterline ML0 by corresponding column select transistors $X2_{14}$ through $X2_0$. Therefore, the capacitive load of the bitlines is distributed half to the lower masterlines ML3 and ML1 and half to the upper masterlines ML0 and ML2. If an odd bitline is selected, the capacitive load is distributed to a lower masterline ML3 or ML1, for example. The reference bitlines refBL<1> and refBL<2> may be coupled either to the masterline ML3 or ML2, or ML1 or ML0, respectively (whichever is not being used by the selected cell), using switches $S_5$ and $S_6$, for example.

The selection of a memory cell at bitline BL<31> will next be described. Column select transistor $X2_{31}$ is switched on, which connects bitline BL<31> to the lower masterline ML3. The column select transistors $X2_{R1}$ and $X2_{R2}$ for the reference cells are switched on, and the connections 28 and 30 in switch $S_5$ and $S_6$, respectively, are made to the top masterlines ML2 and ML0. Switch $S_2$ between the top masterlines ML2 and ML0 is closed in order to average the reference cell currents. Switch S1 between the two lower masterlines ML3 and ML1 stays open.

In the symmetric sense circuit 24 arrangement with odd and even bitlines being connected to two separate masterlines, the effective capacitive load seen at the inputs of the voltage comparators 19 and 22 is substantially equal. In particular, the RC time constants of the sensing paths including masterline ML1 or ML3 are approximately equal to the RC time constants of the two sensing paths connected to the shorted masterline ML2/ML0. During a read operation, the lower masterlines ML1 and ML3 have eight transistors $X2_{31}$, $X2_{29}$ to $X2_{17}$ and $X2_{15}$, $X2_{13}$ to $X2_1$ and one bitline associated with the selected cell or reference cell, respectively, connected to them, and the top masterlines ML2 and ML0 have eight transistors $X2_{30}$, $X2_{28}$ to $X2_{16}$ and $X2_{14}$, $X2_{12}$ to $X2_0$ and one bitline associated with the selected cell or reference cell, respectively, connected to them. While the top masterlines ML2 and ML0 also have reference transistors $X2_{R1}$ and $X2_{R2}$ connected to them, this is not a significant difference in capacitance. So, the symmetric structure produces a symmetric effective capacitive load at the inputs of the voltage comparators 19 and 22. Note that if a bitline is chosen that is connected to a lower masterline, the reference cells should be connected to an upper masterline. Similarly, if a bitline is chosen that is connected to an upper masterline, the reference cells should be connected to a lower masterline. The connection of the reference cells to the upper or lower masterlines ML2/ML0 or ML1/ML3 is made by switches $S_5$ and $S_6$.

Next, the averaging of the two reference cell currents will be described, with reference to the current sense amplifier 12 portion of the symmetric sense circuit 24 of FIG. 5. Assume for purposes of this discussion that the reference bitlines are connected to the bottom masterline ML1/ML3, and the selected cell bitline is connected to the top masterline ML2/ML0. The lower masterline switch S1 connects the two reference bitlines refBL<1> and refBL<2> together. The voltage at the reference bitlines refBL<1> and refBL<2> is kept constant by the BL clamp transistors $X3_2$ and $X3_3$. The reference current of the reference bitlines refBL<1> and refBL<2> is added due to the connection of the lower masterline switch $S_1$. The reference bitlines refBL<1> and refBL<2> current flows through the bitline clamping devices $X3_2$ and $X3_3$ and through load devices $X_{L2}$ and $X_{L3}$, respectively. The reference bitlines refBL<1> and refBL<2> current is added; it flows through two parallel resistors $X_{L2}$ and $X_{L3}$ to $V_{DD}$. The selected cell is coupled to the top masterline ML2. Current from a selected cell (e.g., $X2_{28}$) flows through the BL clamping device $X3_1$ and through one load device, $XL_1$ to $V_{DD}$. The cell current causes a voltage shift at the load device $XL_1$, and the voltage comparator 19 detects this change in voltage at the load device $XL_1$. The load device $XL_1$ transforms the cell current into a voltage, using either a resistive or, preferably, an active semiconductor circuit arrangement such as a current mirror.

To read a selected cell $X2_{28}$, cell current flows through the load device $XL_1$ is transformed to a voltage, and the voltage is seen by the positive input of voltage comparator 19. At the negative input, two load devices $XL_2$ and $XL_3$ are connected in parallel because switch S4 is closed, so their total resistance is half the resistance of load device $XL_1$. The currents of the 1 reference bitline and the 0 reference bitline added together are approximately twice the current of a regular memory cell. This current is fed into two load devices $XL_2$ and $XL_3$ in parallel, which results in half the value of a regular load device, and this divides the current by two again. Thus, the voltage that is created at the parallel connection of load devices $XL_2$ and $XL_3$ is the averaged voltage between a 1 and a 0 reference cell, compared with a voltage of one load device $XL_1$.

Thus, FIG. 5 illustrates a prior art MTJ cell sensing architecture that provides substantially equal time constants on both sides of current sensing amplifiers by symmetrically arranging the current sense amplifiers in pairs, and dividing the MTJ cells into four groups, each group coupled to one of four masterlines. The formation of the four masterlines produces the symmetric sensing arrangement with substantially equal RC time constants at the inputs of the current sensing amplifier pairs. The four masterlines are each hardwired to an inverting or a non-inverting input of one of the sense amplifier pairs, and a switching arrangement selectively couples the even or odd pairs of masterlines together. This structure allows two reference cell currents to be coupled in parallel, and to either an inverting or a non-inverting sense amplifier input. However, a problem with the prior art symmetric sensing scheme in FIG. 5 is that sometimes the top masterline ML2 is used for the sensing path (when reading an even bitline), and other times the bottom masterline ML3 is used for the sensing path (when reading an odd bitline). When the bottom masterline ML3 is used for the sensing path, then the top masterline ML2 is used for the reference cells. In this case, switch $S_2$ is closed to connect load devices $XL_1$ and $XL_4$ in parallel, and the current averaging is accomplished by the load devices $XL_1$ and $XL_4$. With this symmetric sensing structure a single sense amplifier cannot be used, because the averaging has to be accomplished sometimes using the bottom masterline and sometimes using the top masterline. Therefore, the structure requires two voltage comparators, 19 and 22. The two voltage comparators 19 and 22 work together, achieving the averaging either using load devices $XL_1$ and $XL_4$ or the top masterline ML0 and ML2, or, alternatively, using load devices $XL_2$ and XL3 for the bottom masterline ML1 and ML3 in order to achieve the symmetric behavior of the sensing scheme 24.

In memory circuits there are many sources of noise, such as noise from power supplies, output buffers, or internal switching noise of the memory device itself, for example. In order to reduce the influence of these noise sources as much as possible, it is necessary to achieve the same RC time constants for the sensing paths as described above from the selected bitlines to the sense amplifier 12 inputs. If there are two identical RC networks at the voltage comparator inputs, then these RC networks will have substantially similar parasitic responses to noise, and the noise is essentially cancelled. The voltage comparators 19 and 22 see the same parasitic response on both the positive and negative inputs, and they are much less affected.

For a symmetric sensing scheme 24, as shown in the example of FIG. 5, a sense amplifier with a symmetric sensing structure is needed so that potential noise can be cancelled out, leading to fast read times. If there is noise in the sense amplifier, it may take a longer amount of time to read data, because it takes a while for the unwanted capacitive effects to dissipate so that the data can be read. U.S. patent application Ser. No. 10/937,155 is directed toward current sense amplifiers with a symmetric sensing structure.

Figure 6:
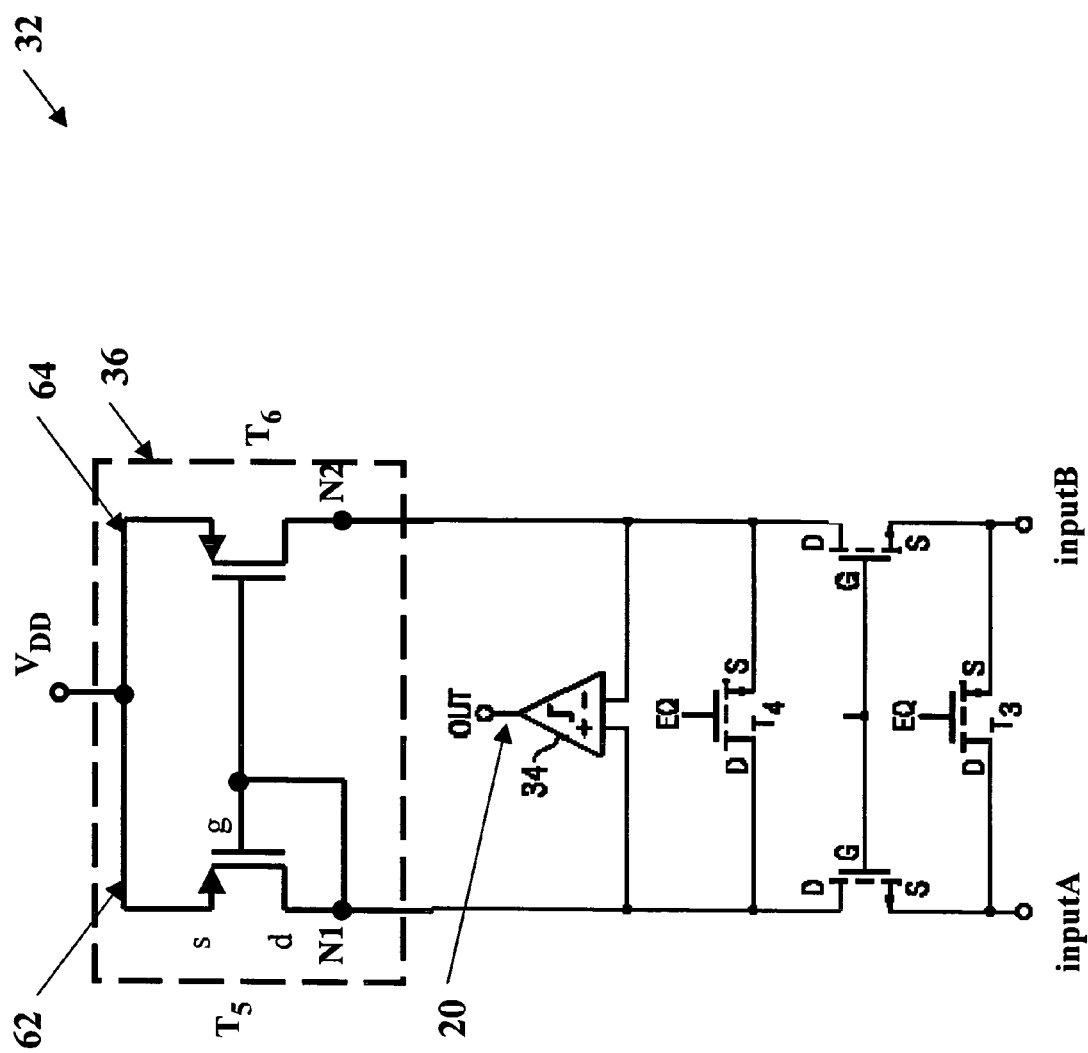
FIG. 6 illustrates a current sense amplifier that includes a voltage comparator, bitline clamping devices, and an illustrative current mirror for comparing a memory cell current to a reference current.

The sensing of resistance of an MTJ cell will now be further described with reference to FIG. 6 in which a current mirror 36 and a voltage comparator 34 are used to sense the resistance of an MTJ cell. Illustrated in FIG. 6 is a current sense amplifier 32 in accordance with an embodiment of the present invention that includes the voltage comparator 34. The current sense amplifier is configured to compare input currents coupled to inputs inputA and inputB, representing currents through a reference cell and a selected MTJ cell, respectively. The drains of bitline clamping transistors X3 and $X3_R$, which preferably comprise MOSFETs, are coupled to the non-inverting and inverting inputs, respectively, of the voltage comparator 34. The sources of transistors $X3_R$ and X3 are connected to a first input signal node inputA and a second input signal node inputB, respectively, as shown. It is assumed that inputB is connected to the selected memory cell by a column selector signal (signal CS in FIG. 4), and that inputA is similarly connected to one or more reference cells producing an average mid-current reading of a "0" and "1" logic memory state. The reference cell current is preferably coupled, for example, to inputA and is mirrored from transistor $T_5$, and creates a drain-source voltage at transistor $T_5$. Alternatively, inputA may be coupled to a memory cell storing the opposite logic state of the selected memory cell. Clamping transistors X3 and $X3_R$ as illustrated on FIG. 6 are n-channel source followers, although other circuit arrangements and other transistor types may be used to clamp a memory cell voltage. The gates of transistors X3 and $X3_R$ are connected to a reference voltage source, $V_{BLCLMP}$, that is preferably configured to provide a bitline clamp voltage as described hereinabove with reference to FIG. 4. Reference voltage $V_{BLCLMP}$ may comprise a voltage level of about 0.7 volts to produce a memory cell voltage of about 200–300 mV, for example, considering FET threshold voltage, although the reference voltage $V_{BLCLMP}$ may alternatively comprise other voltage levels.

Included in the current sense amplifier 32 in FIG. 6 are optional transistor switches $T_3$ and $T_4$, which function as voltage equalizing devices. For example, the source of transistor $T_3$ may be coupled to signal inputB, the drain of transistor $T_3$ may be coupled to signal inputA, the source of transistor $T_4$ may be coupled to the inverting input of the voltage comparator 34, and the drain of transistor $T_4$ may be coupled to the non-inverting input of the voltage comparator 34. The gates of transistors $T_3$ and $T_4$ are coupled to an equalization signal EQ. Before a read operation is initiated, transistors $T_3$ and $T_4$ are activated to ensure that the input signal nodes, inputA and inputB, are at the same potential (i.e., equalized), and also to ensure that the inputs of the comparator 34 are equalized at the same potential. Transistors $T_3$ and $T_4$ are turned off after a short delay after the bitlines are connected and the memory cells are ready to be read. Connecting bitlines ordinarily causes some transient disturbance in the circuit.

The current sense amplifier 32 includes a current mirror 36 preferably comprised of p-channel transistors with drains coupled to the inputs of the voltage comparator 34. The current mirror includes a first transistor $T_5$ coupled between a bias voltage source $V_{DD}$ and clamping device $X3_R$, and a second transistor $T_6$ coupled between the bias voltage source $V_{DD}$ and clamping device X3. An exemplary voltage for the bias voltage source $V_{DD}$ is 1.8 volts, but lower (or higher) voltages may be used in future or other designs. The gates of transistors $T_5$ and $T_6$ are coupled together and to the drain of transistor $T_5$. The transistor $T_5$ is configured as a transistor diode. Transistor $T_6$ is thus configured as a transistor current source.

In a transistor diode configuration, if the gate of a transistor, e.g., transistor $T_5$, is connected to the drain, and a current is applied to the drain, then a voltage is developed at the drain, and the transistor exhibits diode-like behavior. A current applied at inputA passes through the drain of transistor $T_5$, which is connected to the gate of transistor $T_5$, creating a voltage potential between the drain and source of transistor $T_5$. There is no ohmic, linear load, as in a resistor; rather, the behavior is somewhat similar to that of a diode, which exhibits a non-linear voltage-current characteristic.

On side 62, the drain-to-source voltage of transistor $X3_R$ is substantially variable in the sense that this voltage difference is essentially "self-adjusting" to make up the difference between the drain voltage of transistor $T_5$ (at node N1) and the roughly 200–300 mV potential at current-sense input, inputA. However, on side 64, the drain-to-source voltage of transistor $T_6$, which operates in current saturation with its gate voltage determined by transistor $T_5$, is greatly dependent on its drain-to-source current that, after an initial transient, must substantially equal the drain-to-source current of transistor X3. Thus the steady-state drain-to-source current of transistor $T_6$ is substantially determined by the input current at inputB because transistors $T_3$ and $T_4$ are disabled to conduct during the MTJ measurement time. The unequal cell currents from inputA and inputB are converted to a large voltage difference that is coupled to the inputs of comparator 34, particularly by the drain-to-source voltage of transistor $T_6$. The voltage comparator 34 senses the substantial voltage difference resulting from the small difference of currents from inputA and inputB.

If the inputB current is only slightly higher than the inputA current, a large voltage shift at the inverting input of the voltage comparator 36 is created because no substantial current flows into the input terminals of the voltage comparator 34. If additional current is applied at the drain of a transistor in current saturation, a small shift of this current creates a large shift in the drain-source voltage, resulting in a large voltage amplification. This amplified voltage is sensed by the inverting input of the voltage comparator 34 and appears as the signal "OUT" at its output node 20. Thus a large voltage difference is advantageously created between the inverting and non-inverting inputs of the voltage comparator 34, even when the current difference between inputA and inputB is small.

Preferably, transistors $T_5$ and $T_6$ have the same dimensions, the same geometry and the same orientation, and comprise the same type of transistors when equal scaling is required for the input currents, inputA and inputB. Moreover, as is well understood in the art, the currents in a current mirror may be scaled as may be required for a particular circuit design by scaling the areas of the respective transistors to produce a scaled current mirror leg current. Preferably, the operating conditions of both transistors $T_5$ and $T_6$ should be similar (or scaled) to achieve ideal (or scaled) current mirroring performance.

Transistors $T_5$ and $T_6$ thus amplify the voltage difference at the first and second input, inputA and inputB, of the voltage comparator 34 producing a substantial output voltage at the node "OUT" representing a logic state of the selected memory cell. Small differences in currents can be detected in the sides 62 and 63 of the current sense amplifier due to small changes in memory cell resistance as it depends on the state of the memory cell. Transistors $T_5$ and $T_6$ preferably comprise PMOS transistors, and alternatively may comprise NMOS transistors, as examples. Optional equalization switches $T_3$ and $T_4$ may be included in the current sense amplifier and placed directly at inputA and inputB and at the non-inverting and inverting inputs of the comparator stage 34 of the sense amplifier 32.

The current sense circuit illustrated in FIG. 6 is configured to apply equal voltages to the memory cells by means of the clamp transistors X3 and $X3_R$, thereby avoiding, at least in non-transient conditions, altering the charge of unknown parasitic capacitance external to the current sense amplifier, and to provide high sensitivity to small changes in the sensed resistance of a memory cell by means of a current mirror coupled to the drains of the source follower clamps. However, by its very structure in which a constant current is supplied to an MTJ cell being sensed, there is an inherently limited current available to charge parasitic capacitance during transient conditions, which limits speed in sensing MTJ cell resistance.

The accuracy of the current mirror 36 illustrated in FIG. 6 may be improved by stacking an additional, optional cascode device in series with transistor $T_6$. Co-pending U.S. patent application Ser. No. 10/326,367 describes circuit techniques to include a cascode device with the current mirror. A cascode device may be included in the circuit to establish similar operating conditions in the current mirror transistors on both sides thereof, thereby improving its accuracy and capacitive behavior. Thus, a sense amplifier including a cascode device can provide current-sensing accuracy advantages.

The current sense amplifiers as described above depend for their memory sensing operation on a reference current source that is configured using one or two MTJ cells. The accuracy and reliability of current sources can be improved as described in co-pending U.S. patent application Ser. No. 10/982,026 entitled "Reference Current Source for Current Sense Amplifier and Programmable Resistor Configured with Magnetic Tunnel Junction Cell."

Figure 7:
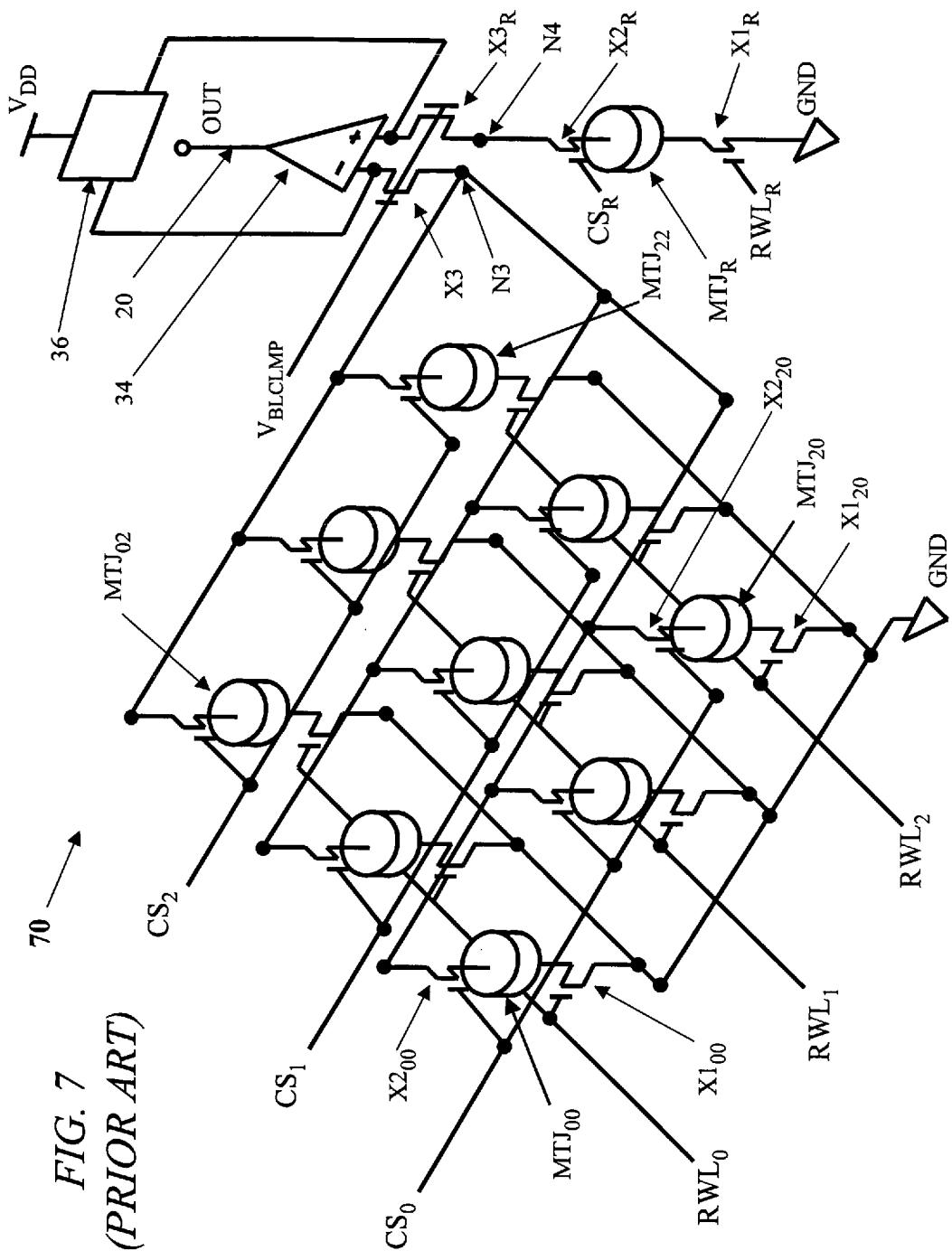
FIG. 7 illustrates a prior art array of MRAM cells coupled to a current sense amplifier that includes a voltage comparator, bitline clamping devices, and a current mirror for comparing a selected memory cell current to a reference current.

To provide a representative illustration of the formation of MTJ cells into an array with a selection switching arrangement to select an MTJ memory cell, including a current mirror, FIG. 7 shows a 3-by-3 array 70 of the prior art of MTJ cells $MTJ_{00}, \ldots, MTJ_{22}$ with their respective wordline select transistors $X1_{00}, \ldots, X1_{22}$ that are driven by wordline select signals $RWL_0, \ldots, RWL_2$. Column select transistors $X2_{00}, \ldots, X2_{22}$ driven by column select signals $CS_0, \ldots, CS_2$ complete the selection of an individual MTJ cell to be sensed. Thus, the selection switches $RWL_0, \ldots, RWL_2$ and $X2_{00}, \ldots, X2_{22}$ collectively form a selection switching arrangement to select an individual MTJ cell for resistance sensing. The array of MTJ cells is coupled to the non-inverting input of voltage comparator 34 with output node 20 through voltage follower X3. A reference current source is configured to produce a current that is the average of the current through an MTJ cell programmed to store a "0" and an MTJ cell programmed to store a "1," using the exemplary MTJ reference cell $MTJ_R$ and switching transistors $X1_R$ and $X2_R$. The reference current source is coupled to the inverting input of voltage comparator 34 through voltage follower $X3_R$. To simplify the illustration in FIG. 6, only one MTJ cell is shown producing the reference current; preferably at least two cells are used such as illustrated in FIG. 4, one programmed to store a "0" and one programmed to store a "1," as previously described. A current equal to that flowing to ground GND though the reference current source is supplied to the array by current mirror 36; current mirror 36 in turn is coupled to the bias voltage source $V_{DD}$. Thus, an MTJ cell to be sensed is supplied with a fixed voltage determined by the reference voltage $V_{BLCLMP}$ (minus the gate-to-source voltage of source follower X3) and the resulting current is compared with the current of a reference cell. The optional voltage equalizing transistors $T_3$ and $T_4$ illustrated on FIG. 6 have been omitted from FIG. 7 for simplicity.

FIG. 7 illustrates the large capacitive loading of the non-inverting input to the voltage comparator 34 through the source follower X3 as represented by circuit node N3. Node N3 is coupled to the drains of all the selection switches X2. The large capacitive loading of N3 is a consequence of the selection switches, $X2_{00}, \ldots, X2_{22}$ in this example, each with its inherent output capacitance, plus the unavoidable capacitance of the numerous interconnecting conductive traces to node N3. Correspondingly, node N4 has far less capacitive loading. Thus substantial charge must be added or removed from node N3 whenever the voltage of node N3 changes. The current available to supply charge to this node is controlled by the current mirror 36, which in turn is set by the reference current source. A significant limitation of this prior art cell sensing arrangement is the time required to charge or discharge the circuit node N3, which must be reduced to achieve increased memory sensing speed and to reduce noise.

Figure 8:
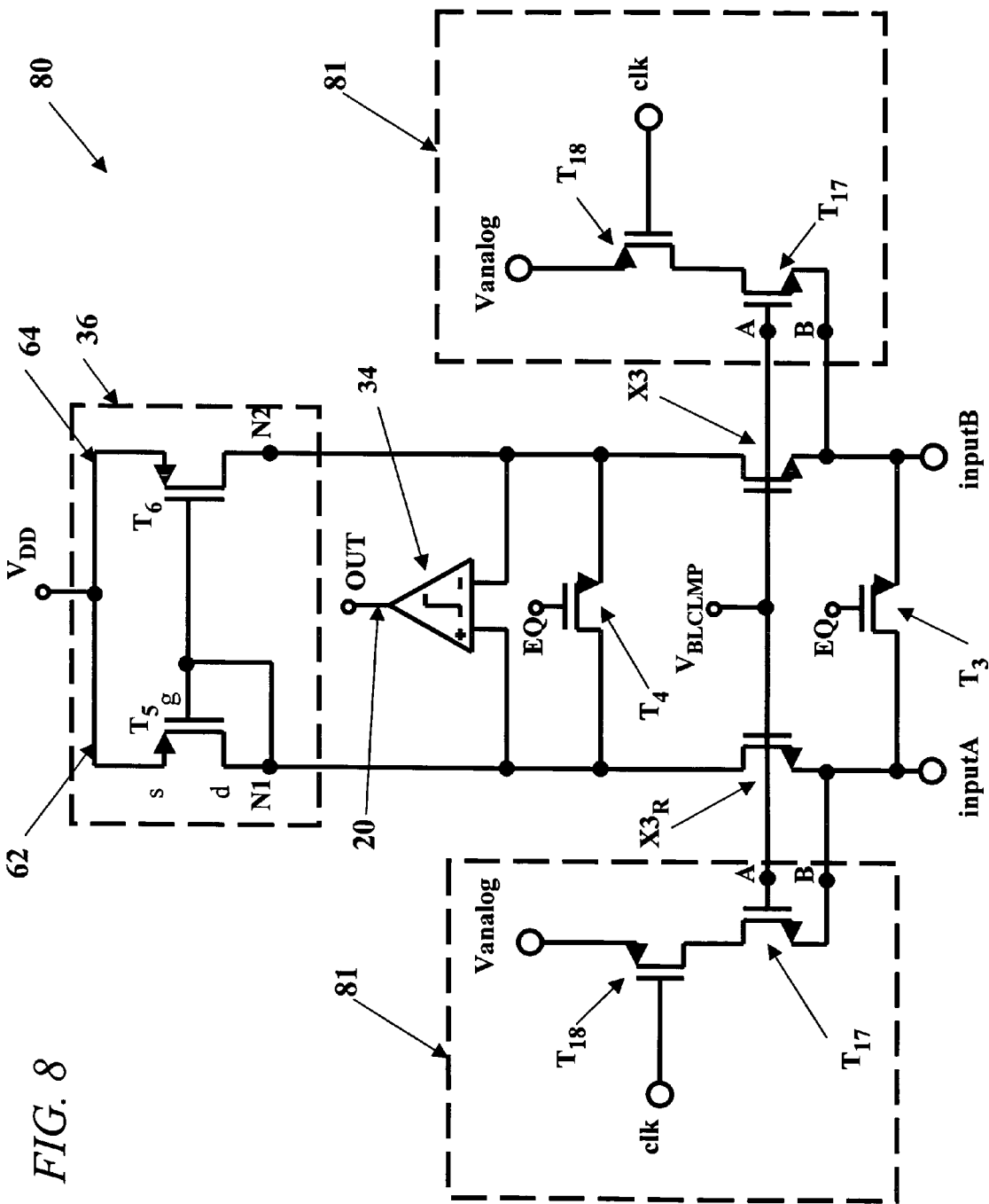
FIG. 8 illustrates a current sense amplifier with bitline boost circuits in accordance with an embodiment of the present invention.

Turning now to FIG. 8, illustrated is a current sense amplifier 80 with bitline boost circuits 81, configured according to the present invention. The added bitline boost circuits provide additional current to reduce the time to add or remove charge from a highly capacitive node in sensing the resistance of a selected MTJ cell or a reference cell.

Each bitline boost circuit 81 includes clamping MOSFET $T_{17}$ configured as a source follower with its gate coupled to the clamping reference voltage source $V_{BLCLMP}$ at node A. The source of MOSFET $T_{17}$ is coupled to the source of the source follower X3 at node B. Preferably the clamping MOSFET $T_{17}$ is an n-channel device. The clamping reference voltage source $V_{BLCLMP}$ was described hereinabove with reference to FIGS. 4 and 5. The drain of the transistor $T_{17}$ is coupled to the drain of a p-channel MOSFET switch $T_{18}$ whose source is coupled to a voltage source Vanalog. The gate of $T_{18}$ is coupled to a control signal clk that allows transistor $T_{18}$ to conduct during a brief period at the start of sensing the resistance of the selected MRAM cell during which transient currents are expected to flow. Thus, the transistor $T_{17}$ functions as a source follower in parallel with X3, and is capable of providing additional current during the transient period.

During the time interval when the current sense amplifier 80 charges the selected bitline, MOSFET $T_{18}$ is activated by the signal clk switching to a low, e.g., ground, potential. Thus, the added source follower $T_{17}$ has its source connected to a current sensing input, e.g., inputA or inputB, while its drain is switched to the voltage source Vanalog. MOSFET $T_{17}$ thus supplies additional current to source follower X3 or $X3_R$ for bitline charging, thereby increasing the selected MRAM cell read speed. Preferably using the same gate length as MOSFETs X3 and $X3_R$ and the same gate voltage, $V_{BLCLMP}$, the transistor dimensions for MOSFET $T_{17}$ and the voltage Vanalog easily can be chosen with values, as is well understood in the art, such that a current sensing input (the connected bitline) can be charged to the same voltage that would have been obtained by MOSFETs X3 or $X3_R$ without the added bitline boost circuit. After sufficient time has elapsed to allow a bitline to be charged to the proper voltage level, MOSFET $T_{18}$ may be switched off by applying a sufficiently high voltage level to its gate by means of the enabling signal clk. Thus, a circuit arrangement has been illustrated and described according to the present invention wherein added bitline boost circuits provide increased charging current for parasitic capacitance to reduce the interval required to sense the programmed state of a selected MRAM cell.

Figure 9:
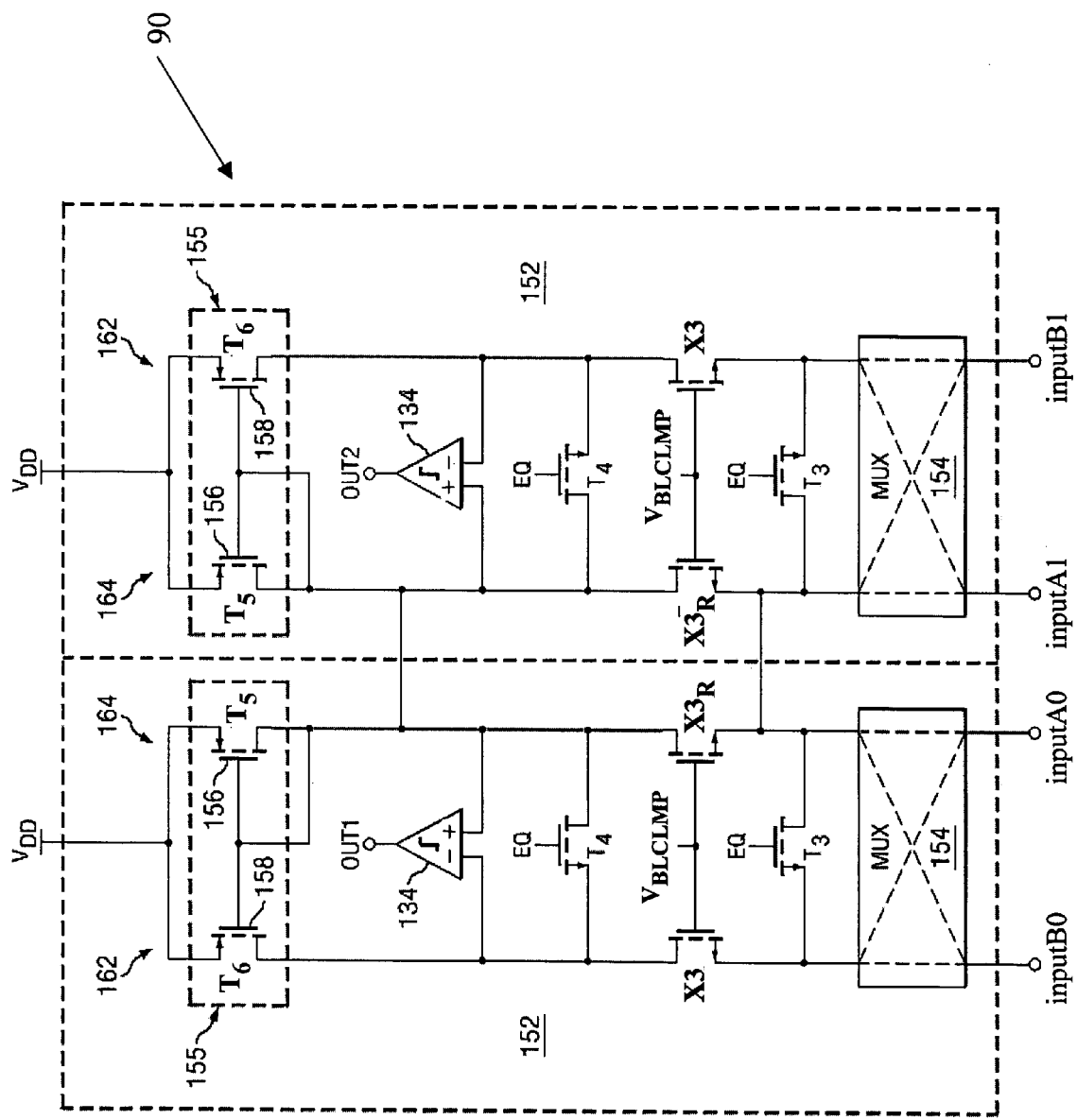
FIG. 9 illustrates a coupled symmetric pair of current sense amplifiers that may be coupled to bitline boost circuits of the present invention.

FIG. 9 illustrates another of various circuit arrangements to which an embodiment of the present invention may be applied. FIG. 9 illustrates a coupled symmetric pair of current sense amplifiers 90, including current sense amplifiers 152 that are adapted for use in a symmetric current sensing arrangement. In this circuit arrangement, sense amplifiers 152 comprise fixed or hard-wired current mirrors 155 ($T_5$ and $T_6$). In order to maintain the ability of the sense amplifier 152 to configure itself for a symmetric sensing configuration to balance the effective capacitive load of the voltage comparator inputs, multiplexing (e.g., using a multiplexer 154 that is placed at the input of the current sense amplifier 152) of the sensing paths is used. The multiplexer 154 is adapted to select whether the first input signal inputB0 (or first input signal inputB1) or second input signal inputA0 (or second input signal inputB1) is connected to the first side 162 or second side 164 of the current mirror 155.

The current sense amplifier 152 includes voltage comparators 134 having a positive (e.g., first) input and a negative (e.g., second) input, the voltage comparators 134 being adapted to output a logic state at "OUT1" (or "OUT2") as indicated on the figure. A first clamping device $X3_R$ is coupled between the positive input of the voltage comparator and the multiplexer 154, the first clamping device $X3_R$ also being coupled to a reference voltage $V_{BLCLMP}$. A second clamping device X3 is coupled between the negative input of the voltage comparator 134 and the multiplexer 154, the second clamping device X3 also being coupled to the reference voltage $V_{BLCLMP}$. The current sense amplifier 152 includes a current mirror 155 having a first side 162 and a second side 164, the current mirror first side 162 including a first transistor $T_6$ coupled between a voltage source $V_{DD}$ and the first clamping device X3. The current mirror 155 second side 164 includes a second transistor $T_5$ coupled between the voltage source $V_{DD}$ and the second clamping device $X3_R$. The first and second transistor $T_5$ and $T_6$ gates are coupled together, and the gate and drain of the second transistor $T_5$ are coupled together. A multiplexer 154 is coupled in the path of the inputs inputA0 and inputB0 (or inputA1 and inputB1) as shown. The multiplexer 154 is adapted to select whether the first input signal inputB0 (or inputB1) or the second input signal inputA0 (or inputA1) is connected to the first or second side of the current mirror.

When used in a symmetric sensing architecture, preferably two or more current sense amplifiers 152 are utilized as a current sensing circuit, as shown in FIG. 9. The current sense amplifiers 152 are preferably connected at transistors $T_5$ of the current mirrors 155 of the current sense amplifiers 152. The current sense amplifiers 152 may also be connected at clamping devices $X3_R$ of the current mirrors 155 of the current sense amplifiers 152, as shown.

In this circuit arrangement, the multiplexing device or devices 154 is/are included between the BL clamp devices X3 and $X3_R$ and the column selector outputs (e.g., the inputs inputA0 and inputB0 (or inputA1 and inputB1) to the sense amplifier 152). The multiplexing device 154 changes the sense amplifier paths, and a column selector is utilized (not shown; see FIG. 5 or 7 for the "X2" column selecting switches) to connect the selected bitlines with the inputs of sense amplifier 152. This allows the current mirror 155 devices, both transistors "$T_5$" to be "hard-wired" together at their drains. The switching between a first side 162 and a second side 164 to optimize or balance the effective capacitive load of the comparator 134 is accomplished by the multiplexer device 154 located at the sense amplifier 152 inputs. The additional capacitance at the sense amplifier 152 input lines from the multiplexer devices 154 does not significantly affect the symmetric sensing scheme because the circuit 152 is relatively insensitive to parasitic effects at this node in comparison to the prior art (e.g., below the clamping devices X3 and $X3_R$).

The multiplexing devices 154 may comprise one or more NFET devices, PFET devices, or both, for example. As shown in FIG. 9, the multiplexer 154 either connects the sense amplifier inputs "directly" to the BL clamp devices or reverses the connection, such that the data input, inputB0 or inputB1, is always connected to the data sides 162 of the comparators and that the reference input, inputA0 or inputA1, is always connected to the reference side 164 of the comparators. Thus, in this circuit arrangement, the sense amplifier 152 is configurable by the multiplexers 154. The current mirror 155 is hard-wired so that transistor $T_5$ is a transistor diode, and transistor $T_6$ is a current source 158. The transistor diode $T_5$ is used in the averaging process of the reference bitlines, which can be connected together. To connect them together, the multiplexer 154 selects which signal, inputA0/inputB0 or inputA1/inputB1 goes into either the first path 162 or second path 164 of the sense amplifier 152.

An equalizing transistor $T_3$ optionally may be coupled between the first input signal and the second input signal, and an equalizing transistor $T_4$ optionally may be coupled between the inputs of the voltage comparator 134, as shown. Note that the multiplexer 154 may comprise a part of the column selector 14 (illustrated in FIG. 5) rather than comprising a part of the current sense amplifier 152. The presence of the current mirrors 155 limit the current available from current sense amplifier 152 to charge parasitic circuit capacitance.

Figure 10:
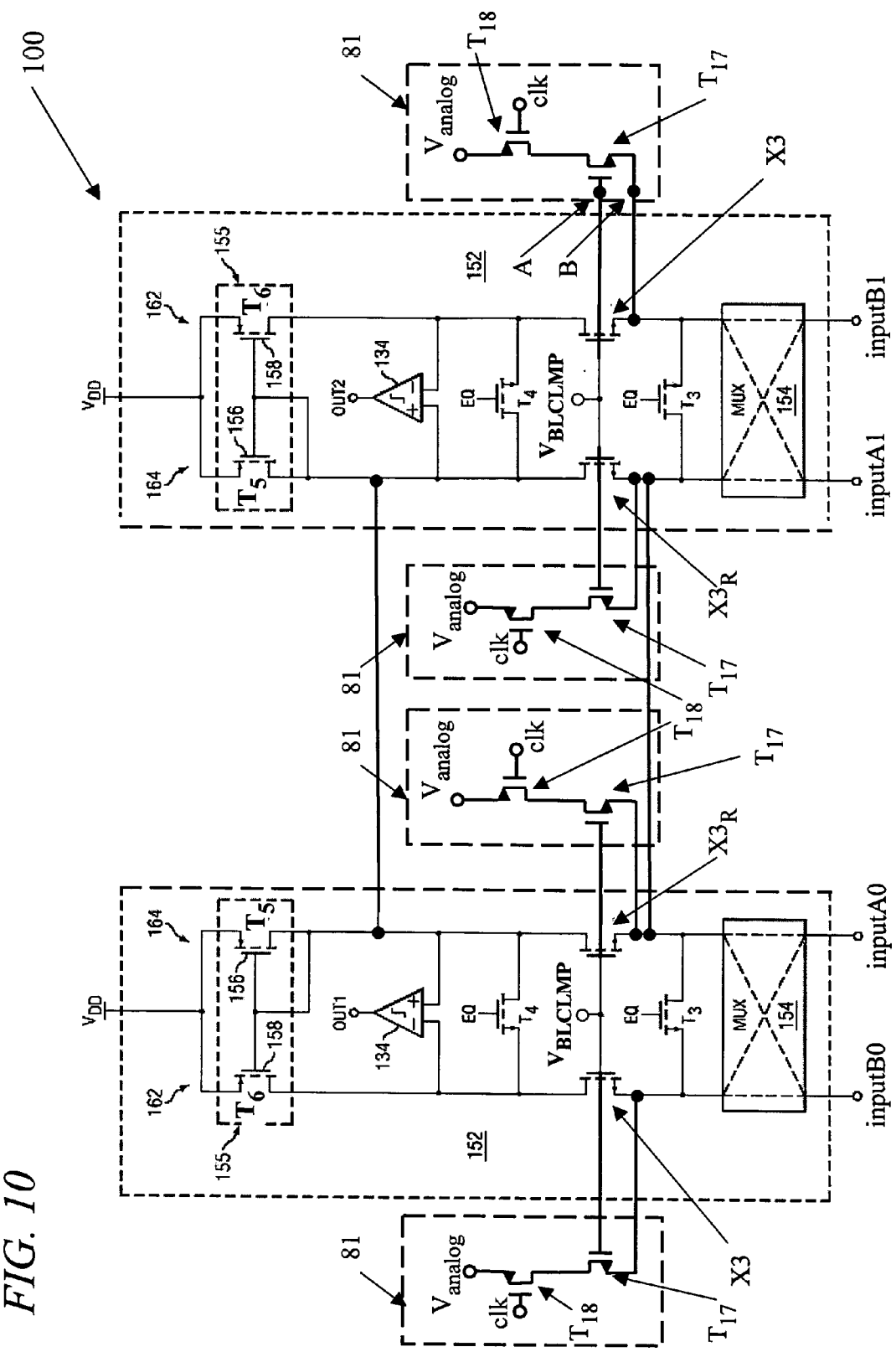
FIG. 10 illustrates bitline boost circuits in accordance with an embodiment of the present invention coupled to the symmetric pair of current sense amplifiers illustrated in FIG. 9.

FIG. 10 illustrates the application of bitline boost circuits, configured according to an embodiment of the present invention, to the coupled symmetric pair of current sense amplifiers 152 described above with reference to FIG. 9. The current sense amplifiers 152 are coupled to the bitline boost circuits 81. The added bitline boost circuits provide additional current to reduce the time required to add or remove charge from nodes that may be highly capacitive in sensing the resistance of a selected MTJ cell or a reference cell, and operate in manner similar to that described above with reference to FIG. 8. Nodes A and B on FIG. 10 illustrate where a bitline boost circuit 81 is coupled to a current sense amplifier, corresponding to similar nodes A and B on FIG. 8.

Figure 11:
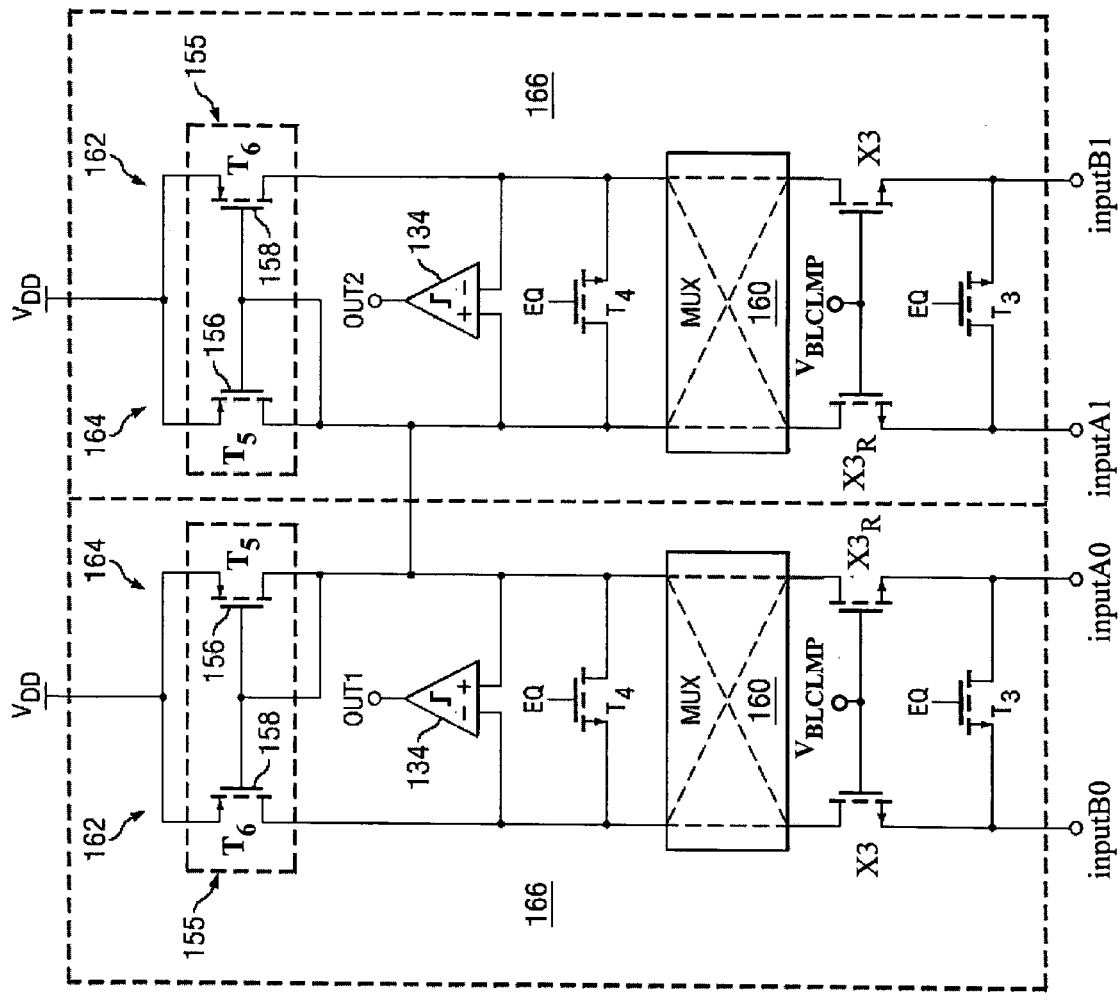
FIG. 11 illustrates a coupled symmetric pair of current sense amplifiers including multiplexers that may be coupled to bitline boost circuits of the present invention.

In FIGS. 9 and 10, the multiplexer 154 adds resistance to the sensing path of the sense amplifier, which may reduce the sensed signal and may require a larger multiplexing device 154. To solve this problem, the multiplexer 160 may be disposed between the clamping devices X3 and X3R and the voltage comparator 134, as shown in the coupled sense amplifier circuit arrangement 166 of FIG. 11. This circuit arrangement of the sense amplifier 166 is advantageous because a smaller multiplexer 160 may be used, and the sense signal is not reduced as much. As in the other circuit arrangements, an equalizing transistor $T_3$ optionally may be coupled between the first input signal and the second input signal, and an equalizing transistor $T_4$ optionally may be coupled between the inputs of the voltage comparator, as shown. When used in a symmetric current sensing architecture, preferably two or more current sense amplifiers 166 are utilized as a current sensing circuit, as described for the circuit arrangement shown in FIG. 9.

Figure 12:
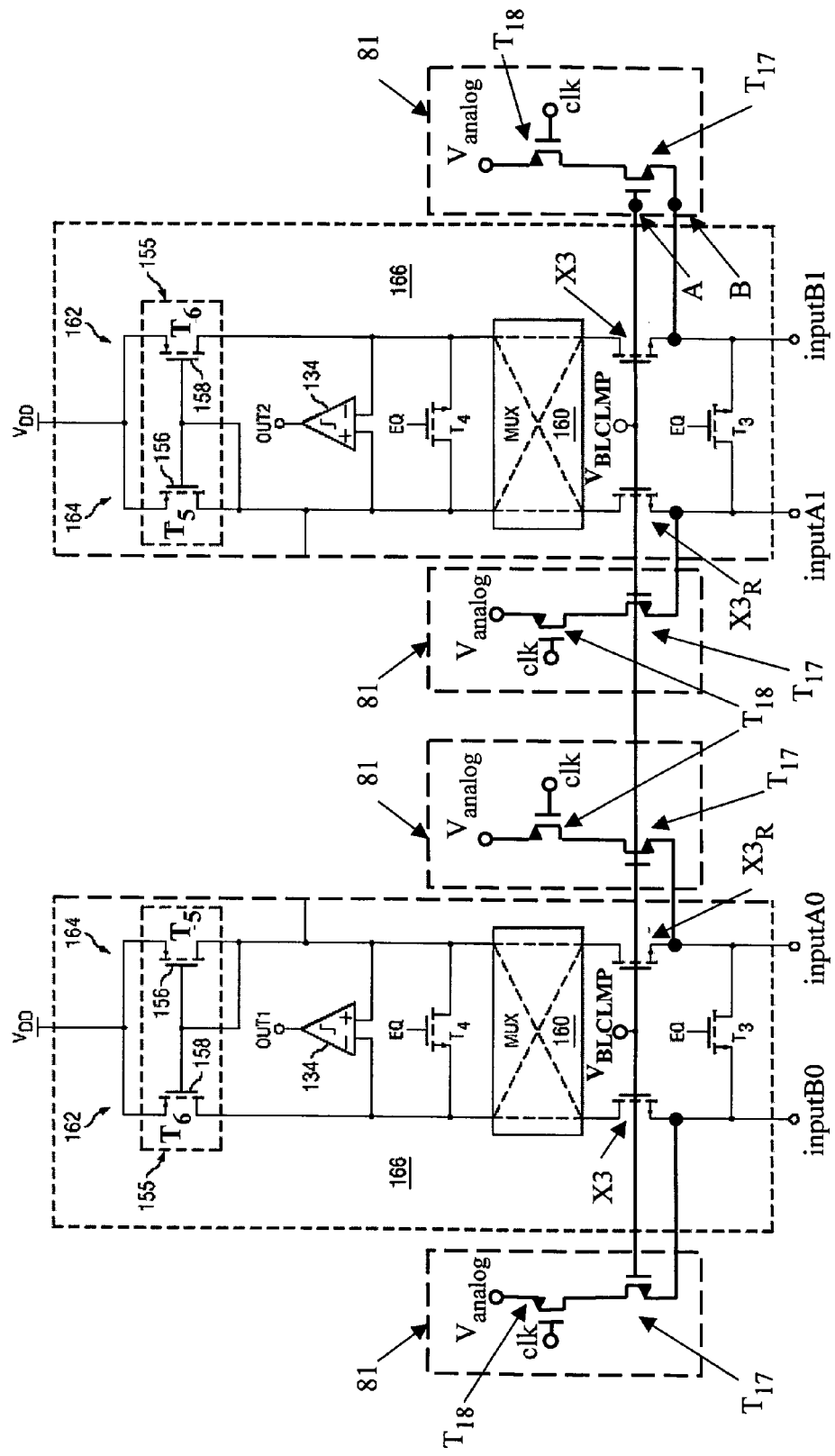
FIG. 12 illustrates bitline boost circuits in accordance with an embodiment of the present invention coupled to the symmetric pair of current sense amplifiers illustrated in FIG. 11.

FIG. 12 illustrates the application of bitline boost circuits, configured according to an embodiment of the present invention, to the coupled symmetric pair of current sense amplifiers 166 described above with reference to FIG. 11. The current sense amplifiers 166 are coupled to the bitline boost circuits 81. The added bitline boost circuits again provide additional current to reduce the time required to add or remove charge from nodes that may be highly capacitive in sensing the resistance of a selected MTJ cell or a reference cell, and, again, operate in manner similar to that described above with reference to FIG. 8. Nodes A and B on FIG. 12 illustrate where a bitline boost circuit 81 is coupled to a current sense amplifier, corresponding to similar nodes A and B on FIGS. 8 and 10.

Figure 13:
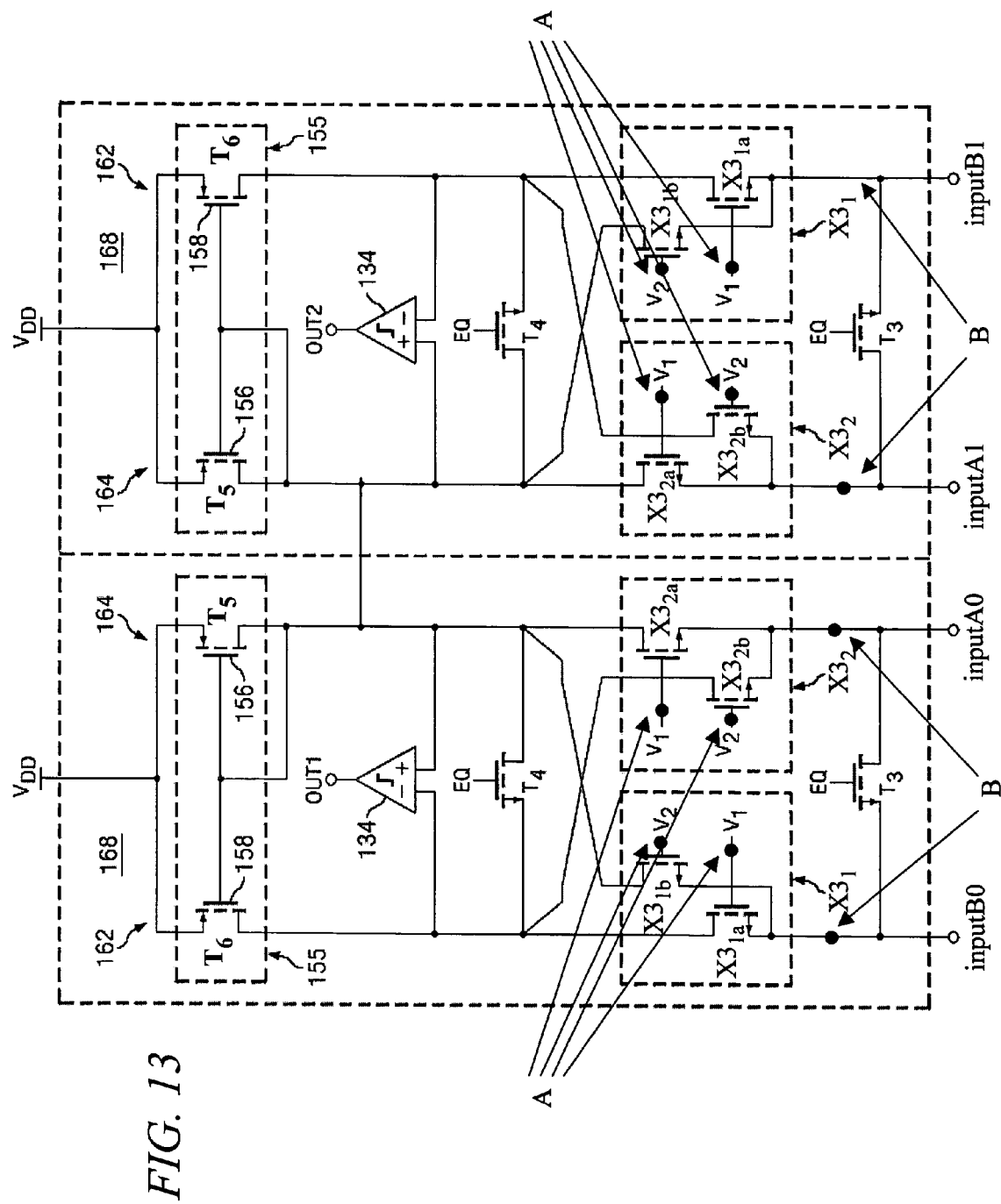
FIG. 13 illustrates a coupled symmetric pair of current sense amplifiers including transistors that provide both switching and clamping functions that may be coupled to a bitline boost circuit of the present invention.

FIG. 13 illustrates still another of various circuit arrangements to which an embodiment of the present invention may be applied. In the circuit arrangement 168 for the current sense amplifier illustrated in FIG. 13, the current mirror transistor "$T_5$" of each sense amplifier is hard-wired so that one device functions as a transistor diode ($T_5$), one device functions as a transistor current source ($T_6$), and the multiplexing is achieved by the clamping devices X3 and $X3_R$. Shown in FIG. 13, clamping device $X3_1$ comprises at least two transistors $X3_{1a}$ and $X3_{1b}$ and clamping device $X3_2$ comprises at least two transistors $X3_{2a}$ and $X3_{2b}$. Transistor $X3_{1a}$ is coupled to an analog signal $V_1$ at its gate, to the first input signal inputB0 at its source, and to the negative input of a comparator 134 at its drain. The gate of transistor $X3_{1b}$ is coupled to an analog signal $V_2$, $X3_{1b}$ source is coupled to $X3_{1a}$ source, and $X3_{1b}$ drain is coupled to the positive input of a comparator 134. Similarly, the gate of transistor $X3_{2a}$ is coupled to the analog signal $V_1$, $X3_{2a}$ source is coupled to the second input signal inputA1, and $X3_{2a}$ drain is coupled to the positive input of a comparator 134. The gate of transistor $X3_{2b}$ is coupled to the analog signal $V_2$, $X3_{2b}$ source is coupled to $X3_{2a}$ source, and $X3_{2b}$ drain is coupled to the negative input of a comparator 134.

Preferably, if signal $V_1$ is on (or high), then signal $V_2$ is 0. Similarly, if signal $V_2$ is on (or high) then signal $V_1$ is 0. $V_1$ and $V_2$ are reference voltages and are preferably analog. For example, $V_1$ and $V_2$ may be $V_{BLCLMP}$ (see description herein above for FIGS. 4 and 5) or 0 V. A circuit (not shown) may be utilized to switch signals $V_1$ and $V_2$ to $V_{BLCLMP}$ or 0. This circuit arrangement 168 is advantageous in that no additional multiplexing devices are required. An optional equalizing transistor $T_3$ may be coupled between the first input signal inputB0 and the second input signal inputA0 (or between the first input signal inputB1 and the second input signal inputA1), and an optional equalizing transistor $T_4$ may be coupled between the inputs of the voltage comparator, as shown. As in the other hard-wired current mirror circuit arrangement 152 and 166, when used in a symmetric sensing architecture, preferably two or more current sense amplifiers 168 are utilized as a current sensing circuit.

Bitline boost circuits, configured according to an embodiment of the present invention, may be applied to the coupled symmetric pair of current sense amplifiers 168 illustrated in FIG. 13 in a manner similar to that described above with reference to FIGS. 11 and 12. The node B of a bitline boost circuit as illustrated in FIG. 8 is coupled to a source of a clamping transistor coupled to a current sensing input, such as inputA0, inputB0, inputA1, or inputB1 in FIG. 13. Node A of a bitline boost circuit is coupled to a gate of the clamping transistor to which it is supplying additional current, such as transistor $T_{1a}$, $T_{1b}$, $T_{2a}$, or $T_{2b}$ in FIG. 13.

Nodes A and B are shown on FIG. 12 to illustrate where the nodes A and B of a bitline boost circuit 81 as illustrated on FIG. 8 would be coupled to a current sense amplifier; the nodes A and B in FIG. 13 correspond to similar nodes A and B indicating points of coupling as shown in FIGS. 8, 10, and 12. The added bitline boost circuits again provide additional current to reduce the time required to add or remove charge from nodes that may be highly capacitive in sensing the resistance of a selected MTJ cell or a reference cell, and, again, operate in manner similar to that described above with reference to FIGS. 8, 9, 10, 11, and 12.

Bitline boost circuits, configured according to an embodiment of the present invention, may be further applied to other configurations of sense amplifiers within the scope of the present invention including, without limitation, sense amplifiers employing a cascode circuit to improve the precision of a current mirror, sense amplifiers employing a reference circuit configured with a large number of reference cells, sense amplifiers employing reconfigurable current mirrors, and sense amplifiers employing other configurations of symmetric or non-symmetric circuits.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the circuits, circuit elements, current sensing arrangements, and utilization of techniques and materials to form the circuits providing increased current to charge capacitance associated with circuit nodes in a current sensing arrangement as described herein may be varied while remaining within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A current sense amplifier, comprising:
   a voltage comparator having a first input, a second input, and an output;
   a first clamping device coupled between the first input of the voltage comparator and a node conducting a first signal, the first clamping device being coupled to a reference voltage;
   a second clamping device coupled between the second input of the voltage comparator and a node conducting a second signal, the second clamping device being coupled to the reference voltage;
   a current mirror coupled between the first and second input of the voltage comparator; and
   a bitline boost circuit, including a source follower and a switch, coupled between the reference voltage and the node conducting the first signal.

2. The current sense amplifier according to claim 1, wherein the bitline boost circuit is configured to clamp the voltage of the first signal at substantially the same level as the first clamping device.

3. The current sense amplifier according to claim 1, wherein the source follower includes a source, a gate, and a drain, the gate being coupled to the reference voltage and the source being coupled to the node conducting the first signal.

4. The current sense amplifier according to claim 3, wherein the drain of the source follower is coupled to the switch, and wherein the switch is coupled to a voltage source.

5. The current sense amplifier according to claim 4, wherein the switch is controlled to conduct during an initial period of sensing the resistance of a memory cell.

6. The current sense amplifier according to claim 1, wherein the source follower is configured with an n-type MOSFET and the switch is configured with a p-type MOSFET.

7. The current sense amplifier according to claim 1, wherein the node conducting the second signal is coupled to at least two reference cells.

8. A memory device comprising the current sense amplifier of claim 1, the current sense amplifier configured to sense the resistance of a memory cell.

9. The current sense amplifier according to claim 8, wherein the bitline boost circuit is configured to provide a current to the node conducting the first signal during an initial period of sensing the resistance of the memory cell.

10. The current sense amplifier according to claim 8, wherein the voltage comparator output indicates the logic state of the memory cell.

11. A method of configuring a current sense amplifier to sense the resistance of a memory cell, comprising:
    providing a voltage comparator having a first input, a second input, and an output;
    coupling a first clamping device between the first input of the voltage comparator and a node conducting a first signal, coupling the first clamping device to a reference voltage;
    coupling a second clamping device between the second input of the voltage comparator and a node conducting a second signal, coupling the second clamping device to a reference voltage;
    coupling a current mirror between the first and second input of the voltage comparator; and
    coupling a bitline boost circuit, including a source follower and a switch, between the reference voltage and the node conducting the first signal.

12. A method of sensing the resistance of a memory cell configured with at least two logic states, the method, comprising:
    receiving a first current signal at a first node;
    clamping a voltage of the first node to a voltage related to a reference voltage;
    receiving a second current signal at a second node;
    clamping a voltage of the second node to the voltage related to the reference voltage;
    mirroring the first current signal to a third node that has a high impedance;
    combining the mirrored signal at the third node with a signal representing the second current;
    determining the logic state of the memory cell from the voltage of the third node; and
    boosting the current flowing into the second node by supplying additional current to the second node while maintaining the clamping voltage of the second node to the voltage related to the reference voltage.

13. The method according to claim 12, wherein the first current signal is proportionately mirrored to the third node.

14. The method according to claim 12, including boosting the current flowing into the second node during an initial period of sensing the resistance of the memory cell.

15. The method according to claim 12, wherein the boosted current flowing into the second node is controlled by a switch coupled to a voltage source.

16. The method according to claim 12, wherein the switch is enabled to conduct during an initial period of sensing the resistance of the memory cell.

* * * * *